(12) United States Patent
Cheng et al.

(10) Patent No.: US 9,911,657 B2
(45) Date of Patent: Mar. 6, 2018

(54) SEMICONDUCTOR DEVICE INCLUDING FINFET AND FIN VARACTOR

(71) Applicants: International Business Machines Corporation, Armonk, NY (US); GlobalFoundries, Inc., Grand Cayman (KY)

(72) Inventors: Kangguo Cheng, Schenectady, NY (US); Junli Wang, Slingerlands, NY (US); Ruilong Xie, Niskayuna, NY (US); Tenko Yamashita, Schenectady, NY (US)

(73) Assignees: INTERNATIONAL BUSINESS MACHINES CORPORATION, Armonk, NY (US); GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/291,750

(22) Filed: Oct. 12, 2016

(65) Prior Publication Data
US 2017/0154821 A1    Jun. 1, 2017

Related U.S. Application Data

(63) Continuation of application No. 14/954,050, filed on Nov. 30, 2015, now Pat. No. 9,520,392.

(51) Int. Cl.
*H01L 29/94* (2006.01)
*H01L 21/8234* (2006.01)
(Continued)

(52) U.S. Cl.
CPC .. *H01L 21/823431* (2013.01); *H01L 27/0629* (2013.01); *H01L 29/6656* (2013.01);
(Continued)

(58) Field of Classification Search
None
See application file for complete search history.

(56) References Cited

U.S. PATENT DOCUMENTS 9,520,392 B1    12/2016  Cheng
2013/0309832 A1*  11/2013  Cheng ............... H01L 21/84
                                                   438/381
(Continued)

OTHER PUBLICATIONS

Cheng et al., "Semiconductor Device Including Finfet and Fin Varactor", U.S. Appl. No. 15/181,676, filed Jun. 14, 2016.
(Continued)

*Primary Examiner* — Shaun Campbell
(74) *Attorney, Agent, or Firm* — Cantor Colburn LLP; Vazken Alexanian

(57) ABSTRACT

A semiconductor device includes a semiconductor substrate having a fin-type field effect transistor (finFET) on a first region and a fin varactor on a second region. The finFET includes a first semiconductor fin that extends from an upper finFET surface thereof to the upper surface of the first region to define a first total fin height. The fin varactor includes a second semiconductor fin that extends from an upper varactor surface thereof to the upper surface of the second region to define a second total fin height that is different from the first total fin height of the finFET.

15 Claims, 20 Drawing Sheets

(51) Int. Cl.
*H01L 27/06* (2006.01)
*H01L 29/93* (2006.01)
*H01L 29/78* (2006.01)
*H01L 29/66* (2006.01)

(52) U.S. Cl.
CPC .. *H01L 29/66174* (2013.01); *H01L 29/66537* (2013.01); *H01L 29/785* (2013.01); *H01L 29/93* (2013.01)

(56) References Cited

U.S. PATENT DOCUMENTS

| | | | | |
|---|---|---|---|---|
| 2014/0117462 A1* | 5/2014 | Cheng | ............... | H01L 29/66803 257/410 |
| 2015/0097220 A1* | 4/2015 | Ponoth | ................ | H01L 27/0629 257/296 |
| 2016/0079124 A1* | 3/2016 | Yin | ................... | H01L 21/82343 438/283 |
| 2016/0163694 A1* | 6/2016 | Baek | ................... | H01L 27/0629 257/300 |

OTHER PUBLICATIONS

List of IBM Patents or Patent Applications Treated as Related; (Appendix P), Filed Jan. 13, 2017; 2 pages.

\* cited by examiner

US 9,911,657 B2

SEMICONDUCTOR DEVICE INCLUDING FINFET AND FIN VARACTOR

CROSS-REFERENCE TO RELATED APPLICATIONS

The present application is a Continuation of U.S. patent application Ser. No. 14/954,050, entitled "SEMICONDUCTOR DEVICE INCLUDING FINFET AND FIN VARACTOR", filed on Nov. 30, 2015, which is incorporated herein by reference in its entirety.

BACKGROUND

The present invention relates to semiconductor devices, and more specifically, to fin-type field effect transistors (finFETs).

Variable reactors, also known as variable capacitors and "varactors" are electronic devices (e.g., solid-state diodes) that have a capacitance that is controlled by a suitable voltage or current bias. For example, as a reverse voltage is applied to a PN junction of a varactor diode, electrons in the n-region are attracted to the cathode while holes in the p-region are attracted to the anode. This results in the formation of a depletion region between the anode and cathode that behaves as the dielectric of the device. As the applied reverse voltage increases, the depletion region (i.e., dielectric) widens, while the capacitance across the PN junction decreases since capacitance is inversely proportional to dielectric thickness. Therefore, by varying the reverse voltage across a PN junction of a varactor diode, the junction capacitance can be varied.

The variability of the capacitance in a varactor may be employed to provide useful function in various types of electronic circuits such as, for example, amplifiers, oscillators, and frequency synthesizers. As a non-limiting example, varactors may be used to construct voltage-controlled oscillators (VCOs), which can generate a tunable stable frequency (e.g., controllable by an applied current or voltage) without employing a circuit with multiple oscillators. A VCO is a versatile basic building block for constructing transceiver circuitry, phase locked loop (PLL) circuitry and other wireless communication circuitry. In such instances, VCOs may be used when a variable frequency is required or when a signal is to be synchronized to a reference signal, as non-limiting examples. Varactors are also used in other electronic application including, for example, frequency multipliers, harmonic generators, and modulation/demodulation operations.

In general, varactor designs take into account a number of design parameters. One such parameter is "tunability," which is typically defined as the ratio between the highest and lowest capacitive values (Cmax/Cmin) over the range of applied voltages for the circuit. Another property is "linearity." There are two definitions for "linearity": (i) 1/√{square root over (C)}; and (ii)

$$\frac{d(\ln C)}{dV},$$

where C is the voltage-dependent varactor capacitance. In the first case (i), it is desirable that 1/√{square root over (C)} be a straight line and in the second case (ii) that $$\frac{d(\ln C)}{dV}$$

be a constant, both as V varies. Yet another design parameter that is taken into account the quality factor "Q", which is a function of the series resistance of the diode and the capacitive value of the varactor at the higher frequency ranges of the circuit.

SUMMARY

According to a non-limiting embodiment of the present invention, a method of forming a semiconductor device includes forming a first fin corresponding to a field effect transistor (FET) on a first region of a semiconductor substrate and forming a second fin corresponding to a varactor on a second region of the semiconductor substrate. The method further includes recessing the first region with respect to the second region so as to increase a physical height of the first fin with respect to a physical height of the second fin. The method further includes doping the first fin and the second fin so as to form a finFET in the first region and a fin varactor in the second region.

According to another non-limiting embodiment, a method of forming a semiconductor device includes patterning a semiconductor substrate including a first region and a second region so as to form a plurality of semiconductor fins. The method further includes recessing the first region with respect to a second region so as to form a first semiconductor fin in the first region having a first total height and a second semiconductor fin in the second region having a second total height that is less than the first total height. The method further includes doping a first fin portion of the first semiconductor fin to form a finFET and entirely doping the second semiconductor fin to form a fin varactor.

According to yet another non-limiting embodiment, a method of forming a semiconductor device includes patterning a semiconductor substrate including a first region and a second region so as to form a plurality of semiconductor fins. The method further includes recessing the first region with respect to a second region so as to form a first semiconductor fin in the first region having a first total height and a second semiconductor fin in the second region having a second total height that is less than the first total height. The method further includes doping a first fin portion of the first semiconductor fin to form a finFET and entirely doping the second semiconductor fin to form a fin varactor.

According to yet another non-limiting embodiment, a method of forming a semiconductor device includes patterning a semiconductor substrate including a first region and a second region so as to form a plurality of semiconductor fins. The method further includes recessing the first region with respect to a second region so as to form a first semiconductor fin in the first region having a first total height and a second semiconductor fin in the second region having a second total height that is less than the first total height. The method further includes reducing a thickness of a first portion of the first semiconductor fin so as to adjust a first resistance of the first semiconductor fin with respect to a second resistance of the second semiconductor fin. The method further includes doping the first portion of the first semiconductor fin to form a finFET and entirely doping the second semiconductor fin to form a fin varactor.

According to still another non-limiting embodiment, a semiconductor device comprises a semiconductor substrate including a first region and a second region. A fin-type field effect transistor (finFET) includes a first semiconductor fin on an upper surface of the first region, the first semiconductor fin extending from an upper finFET surface thereof to the upper surface of the first region to define a first total fin height. A fin varactor includes a second semiconductor fin on an upper surface of the second region, the second semiconductor fin extending from an upper varactor surface thereof to the upper surface of the second region to define a second total fin height that is different from the first total fin height of the finFET.

According to another non-limiting embodiment, a semiconductor device comprises a semiconductor substrate including a varactor region and a transistor region. A fin varactor includes a first semiconductor fin on an upper surface of the varactor region, the first semiconductor fin extending uniformly from an upper varactor fin surface thereof to the upper surface of the varactor region to define a single thickness between opposing respective sidewalls. A fin varactor includes a second semiconductor fin on an upper surface of the second region, the second semiconductor fin extending from an upper varactor surface thereof to the upper surface of the second region to define a second total fin height that is different from the first total fin height of the finFET.

Additional features are realized through the techniques of the present invention. Other embodiments are described in detail herein and are considered a part of the claimed invention. For a better understanding of the invention with the features, refer to the description and to the drawings.

BRIEF DESCRIPTION OF THE DRAWINGS

FIGS. 2-12 are a series of views illustrating a method of forming a semiconductor device according to non-limiting embodiments in which:

FIG. 2 is a cross-sectional view of an intermediate semiconductor device including a first set of semiconductor fins formed in a transistor region of a substrate and a second set of semiconductor fins formed in a varactor region of the substrate according to a non-limiting embodiment;

FIG. 3 illustrates the semiconductor device of FIG. 2 following a patterning process that exposes a portion of an underlying masking layer which is formed atop the substrate to cover the first and second set of fins;

FIG. 4 illustrates the semiconductor device of FIG. 3 following a first etching process selective to the masking layer so as to expose the transistor region and the first set of region;

FIG. 5 illustrates the semiconductor device of FIG. 4 after removing the remaining photoresist layer and following deposition of a conformal layer that covers the sidewalls and upper surface of the first set of fins formed in the transistor region and that covers the sidewalls and upper surface of the remaining masking layer formed in the varactor region;

FIG. 6 illustrates the semiconductor device of FIG. 5 following a directional etching process selective to the conformal spacer layer so as to form first spacers on sidewalls of the first set of fins and second spacers on sidewalls of the masking layer;

FIG. 7 illustrates the semiconductor device of FIG. 6 following an etching process selective to the semiconductor substrate so as to recess the transistor region and increase the physical height of the first set of fins;

FIG. 8 illustrates the semiconductor device of FIG. 7 after stripping away the masking layer such that a first set of fins in the transistor region have a different physical height than the second set of fins in the varactor region;

FIG. 9 illustrates the semiconductor device of FIG. 8 undergoing a doping process to form electrically insulating regions in the exposed portions of the first set of fins, the second set of fins, and exposed portions of the semiconductor substrate located in the transistor and varactor regions;

FIG. 10 illustrates the semiconductor device of FIG. 9 after removing the first and second spacers such that the first set of fins are formed with an upper fin portion having a first thickness and a lower fin portion having a different second thickness;

FIG. 11 illustrates the semiconductor device of FIG. 10 following deposition of a block dielectric layer atop the semiconductor substrate so as to cover the first set of fins and the second set of fins;

FIG. 12 illustrates the semiconductor device of FIG. 10 after performing an etching process selective to the substrate which stops on an upper surface of the varactor so as to expose the upper portion of the first set of fins and completely exposes the second set of fins.

FIGS. 14-20 are a series of views illustrating a method of forming a semiconductor device according to another non-limiting embodiment in which:

FIG. 14 illustrates an intermediate semiconductor device following an etching process selective to a semiconductor substrate so as to recess a transistor region with respect to a varactor region which increases the physical height of a first set of semiconductor fins with respect to a second set of semiconductor fins;

FIG. 15 illustrates the semiconductor device of FIG. 14 following a directional etching process selective to semiconductor material so as to reduce the thickness a lower portion of the first set of fins located beneath the spacers formed on an upper portion of the first set of fins according to a non-limiting embodiment;

FIG. 16 illustrates the semiconductor device of FIG. 15 undergoing a doping process to form electrically insulating regions in exposed portions of the first set of fins, the second set of fins, and exposed portions of the semiconductor substrate located in the transistor and varactor regions;

FIG. 17 illustrates the semiconductor device of FIG. 16 showing the thinned first set of fins formed in the transistor region have a first total height and the second set of fins formed in the varactor region have a second total height that is less than the first total height;

FIG. 18 illustrates the semiconductor device of FIG. 17 following deposition of a block dielectric layer atop the semiconductor substrate so as to cover the first set of fins and the second set of fins;

FIG. 19 illustrates the semiconductor device of FIG. 18 after performing an etching process selective to the substrate which stops on an upper surface of the varactor so as to expose the upper portion of the first set of fins and completely exposes the second set of fins; and FIG. 20 illustrates the semiconductor device of FIG. 19 after forming a first gate structure that wraps around the first set of fins so as to form a finFET in the transistor region, and forming a second gate structure that wraps around the second set of fins so as to form a fin varactor in the varactor region.

DETAILED DESCRIPTION

Various embodiment of the invention provide a semiconductor device including a finFET structure and a fin varactor structure formed on a common semiconductor substrate. Unlike conventional semiconductor devices that include a finFET and a fin varactor on a common substrate, at least one embodiment of the invention provides a semiconductor device of which the fins of the finFET have a greater physical height compared to the varactor fins. Accordingly, the fin varactor has a reduced body resistance compared to conventional fin varactors that share a common substrate with a finFET device. In at least one embodiment, the thinness of the finFET fins may be adjusted with respect to the varactor fins. In this manner, the body resistance of the semiconductor device can be further tuned.

Figure 1:
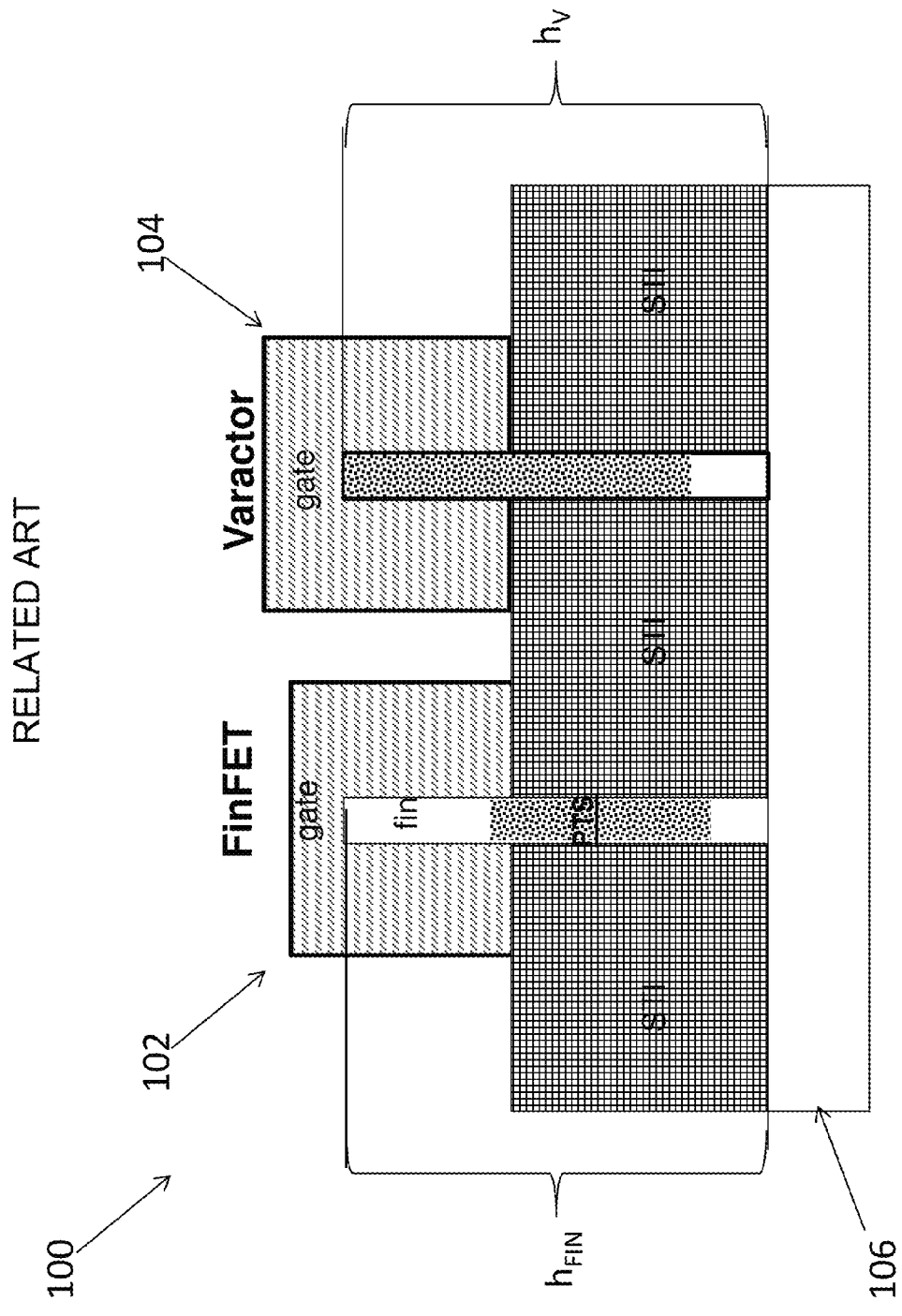
FIG. 1 is a cross-sectional view of a conventional semiconductor device including a finFET and fin varactor having matching physical fin heights formed on a common substrate.

Referring to FIG. 1, a semiconductor device 100 is shown including a finFET 102 and a fin-type varactor 104 (hereinafter referred to as a fin varactor 104) formed on a common substrate 106. Conventional fin varactor fabrication processes result in in the fin portion height ($h_V$) of the fin varactor 104 being equal to or substantially equal to the fin height ($h_{FIN}$) of finFET 102. Therefore, conventional fin varactors 104 are typically subject to high body resistance due to the overall minimum width limitations of the finFET 102. This high body resistance affects the design parameters of the varactor including, for example, the quality factor. Therefore, these conventional fin varactors may not be suitable for high frequency applications. Conventional attempts for overcoming the high body resistance issue typically involve forming the varactor portion as a planar device (i.e., two-dimensional device) while maintaining the fin topology (i.e., three-dimensional device) of the transistor portion. However, such an approach causes process challenges as it calls for excessive fabrication processes in order to achieve both the three-dimensional finFET topology and the two-dimensional varactor topology on a single wafer.

Figure 2:
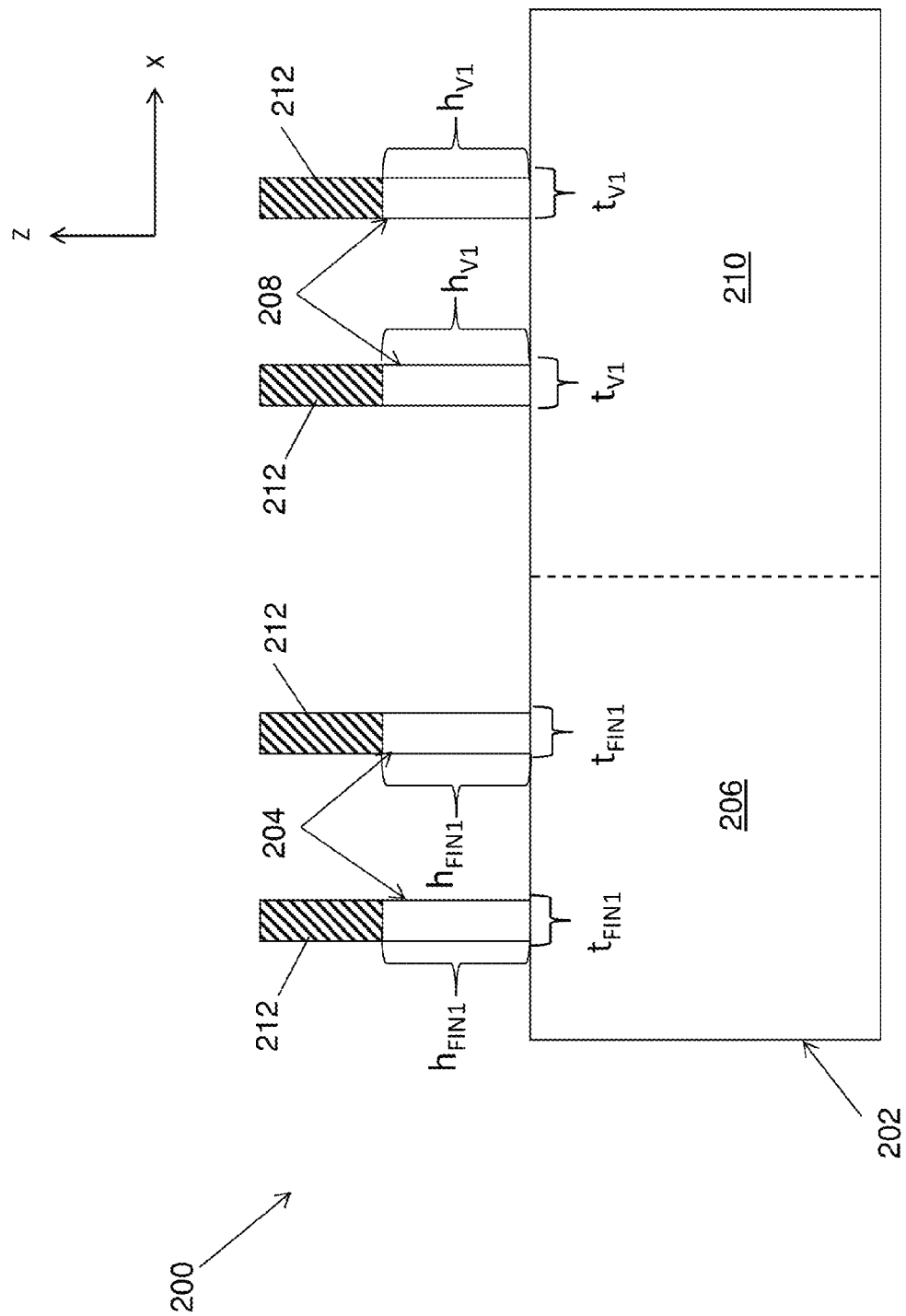

With reference now to FIG. 2, an intermediate semiconductor device 200 is illustrated according to a non-limiting embodiment. In the present specification and claims, an "intermediate" semiconductor device is defined as an interconnect structure in a stage of fabrication prior to a final stage. The semiconductor device 200 includes a semiconductor substrate 202 extending along a first direction (e.g., the X-axis) to define a width and second direction (e.g., the Z-axis) to define a height or vertical thickness. In at least one embodiment, the semiconductor substrate 202 is formed of, for example, silicon (Si).

The semiconductor device 200 further includes a plurality of semiconductor fins formed on an upper surface of the substrate 202. In at least one embodiment, one or more first semiconductor fins 204 comprising Si, for example, are formed in a first substrate region 206 (e.g., a transistor region 206) and one or more second semiconductor fins 208 are formed in a second substrate region 210 (e.g., a varactor region 210). Hereinafter, the first semiconductor fins 204 will be referred to as transistor fins 204, while the second semiconductor fins 208 will be referred to as varactor fins 208. Although the transistor region 206 and the varactor region 210 are each shown to contain two fins, it should be appreciated that fewer fins (e.g., one fin) or more fins (e.g., four fins) may be formed in each region. The transistor fins 204 and the varactor fins 208 may have an initial height (e.g., a vertical length extending along the Z-axis) ranging from approximately 20 nm to approximately 60 nm), and an initial thickness (e.g., a horizontal width extending along the X-axis) ranging from approximately 4 nm to approximately 15 nm). The initial height ($h_{FIN1}$) of the transistor fins 204 is equal or substantially equal to the initial height ($h_{V1}$) of the varactor fins 208, and the initial thickness ($t_{FIN1}$) of the transistor fins 204 is equal or substantially equal to the initial thickness ($t_{V1}$) of the varactor fins 208. However, the invention is not limited thereto and it should be appreciated that other embodiments may allow for the transistor fins 204 and the varactor fins 208 to have different thickness with respect to one another.

Various patterning techniques may be used to form the transistor fins 204 and the varactor fins 208. For example, a suitable hardmask blocking layer (not shown) formed of silicon oxide, for example, can be initially deposited on an upper surface of the substrate 202. A suitable hardmask cap layer (not shown) formed of silicon nitride (SiN), for example, is subsequently deposited atop the hardmask blocking layer.

Next, the hardmask blocking layer and the hardmask cap layer are etched to define the desired fin pattern. A developed photoresist mask (not shown) is typically used to define the desired fin pattern. The hardmask blocking layer and hardmask cap layer can then be patterned selective to the developed photoresist mask according to a reactive ion etch (ME) process. The patterned hardmask layers will then be used to transfer the desired fin pattern into the underlying substrate layer 202 according to a RIE process to define the transistor fins 204 in the transistor region 206 and the varactor fins 208 in the varactor region 210. It should be appreciated that the initial height (e.g., vertical length) and thickness (e.g., horizontal width) of the patterning can be determined according to the desired fin dimensions for the particular application. The hardmask caps 212 remaining on the upper surfaces of the transistor fins 204 and varactor fins 208 may be used later to protect the fins while performing an etching process that adjusts the physical height of one or more of the fins as described in greater detail below.

Figure 3:
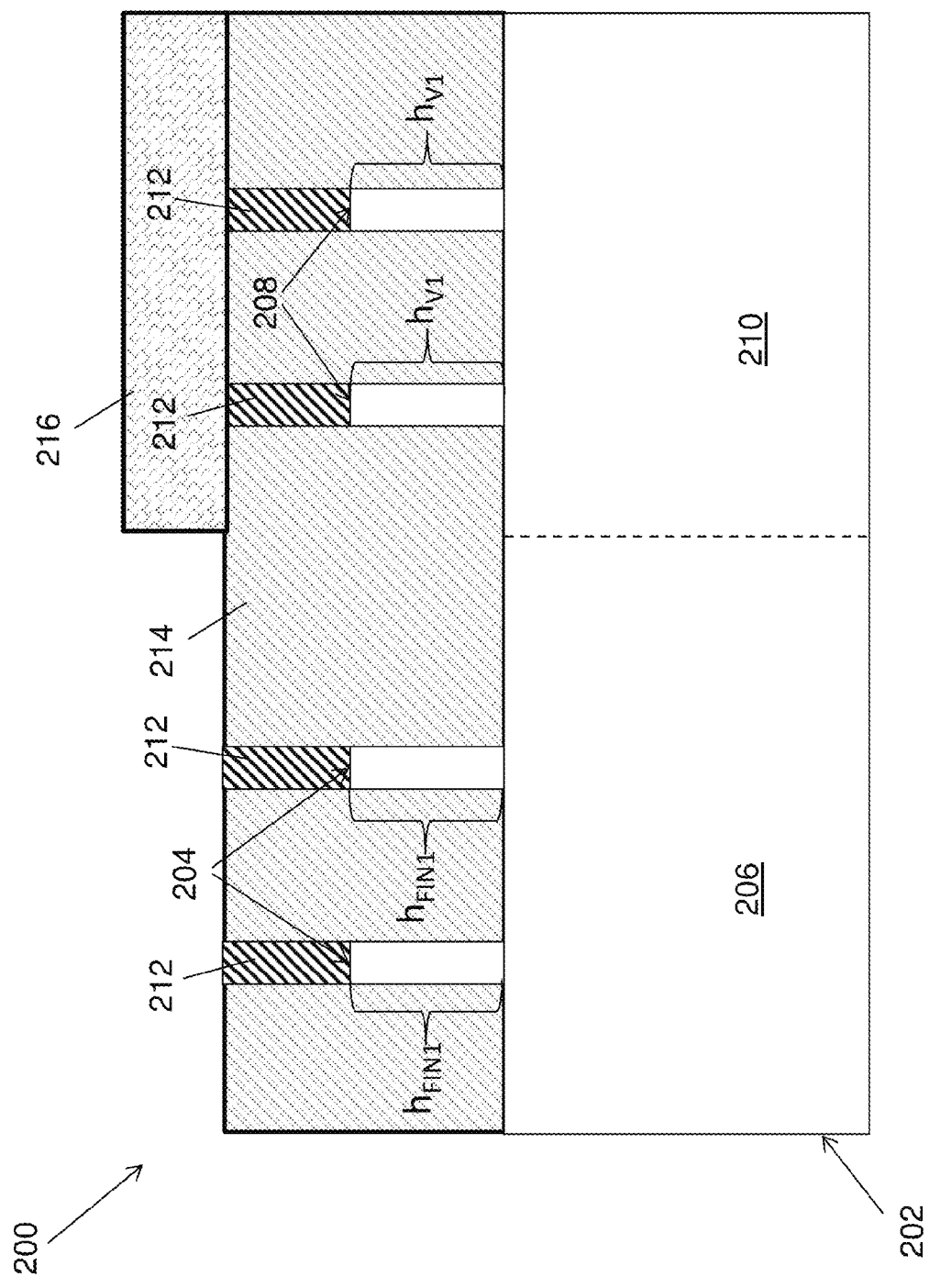

Referring to FIG. 3, the semiconductor device 200 is shown including a block masking layer 214 interposed between the substrate 202 and a pattern layer 216 (e.g., a photoresist layer). The masking layer 214 formed from, for example, amorphous carbon, is deposited using various techniques including, but not limited to, chemical vapor deposition (CVD) so as to cover the upper surface of the hardmask caps 212. A planarization process such as chemically mechanical planarization (CMP) can be used to planarize the amorphous carbon. The photoresist layer 216 may be formed from various photolithographic materials that are sensitive to light in order to facilitate a photolithography patterning process as understood by one of ordinary skill in the art. According to a non-limiting embodiment, a first patterning process is performed which exposes a portion of the underlying masking layer 214 located in the transistor region 206 as further illustrated in FIG. 3.

Figure 4:
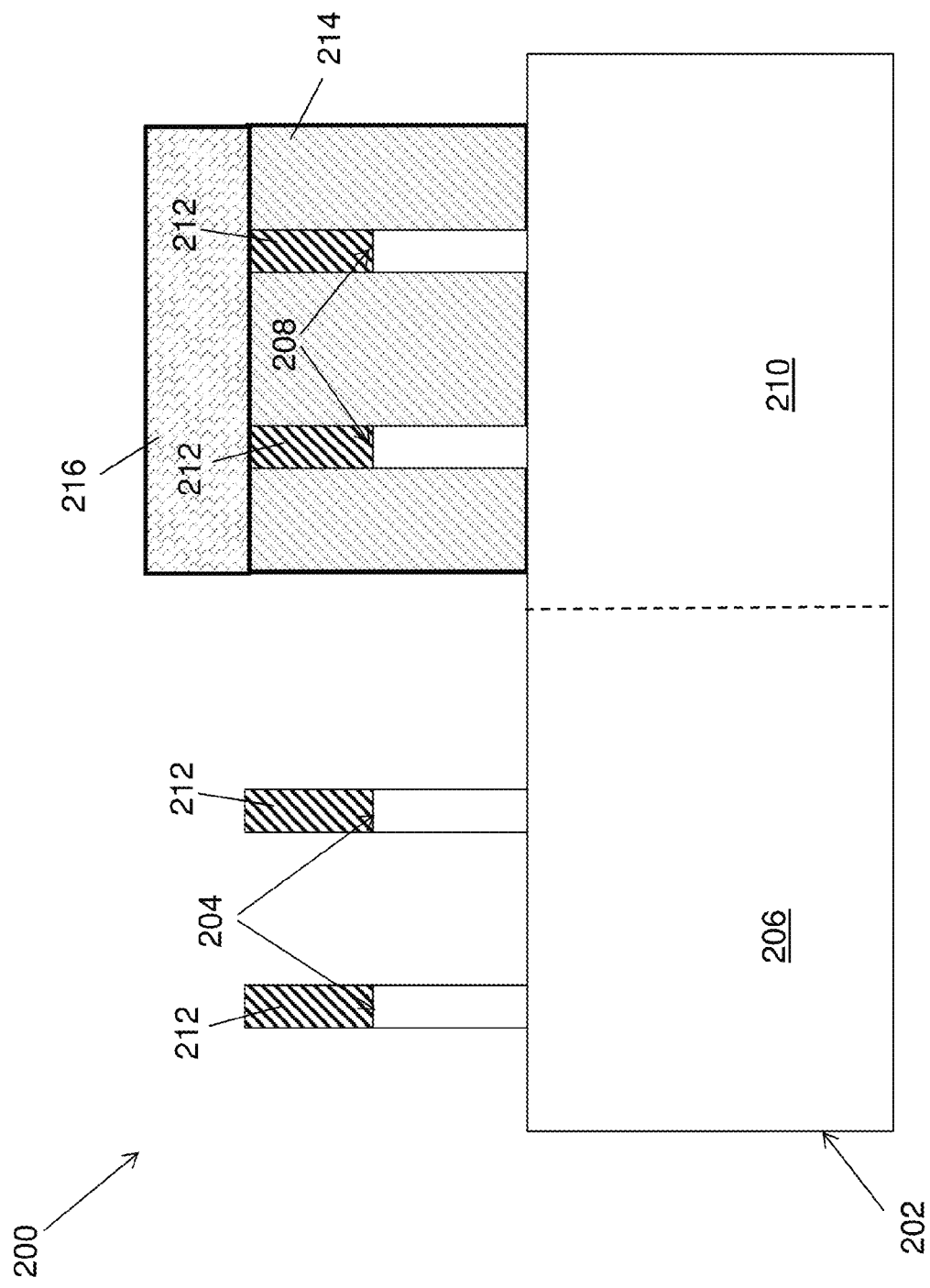

Turning to FIG. 4, the semiconductor device 200 is illustrated following a first etching process that exposes the transistor fins 204 and the upper surface of the substrate 202 located in the transistor region 206. In at least one embodiment, the first etching process is a reactive ion etch (RIE) process that is selective to the material of the substrate (e.g., Si). In this manner, the transistor fins 204 and the transistor region 206 is exposed while the varactor fins 208 and the varactor region 210 remains covered.

Figure 5:
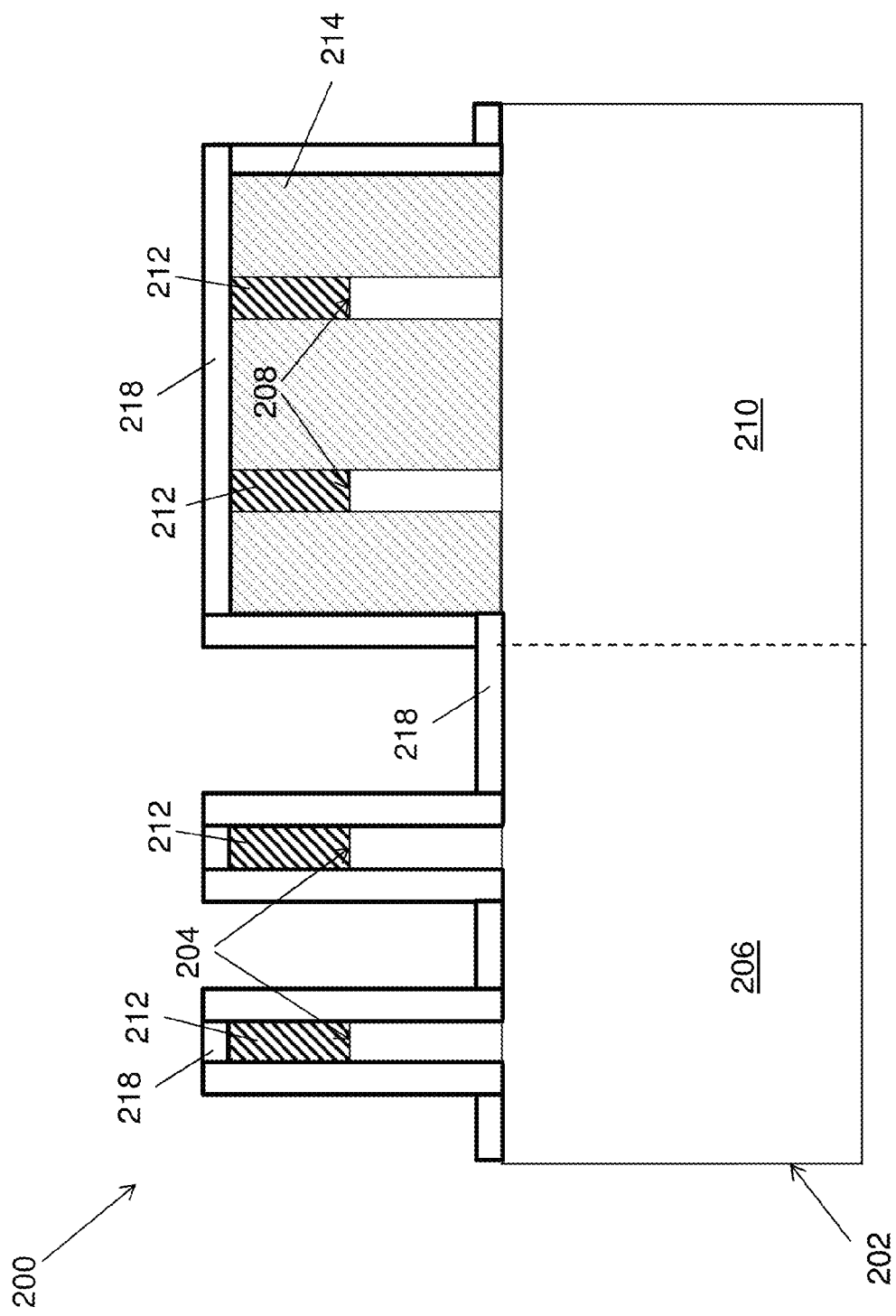

Referring to FIG. 5, the semiconductor device 200 is illustrated following deposition of a conformal spacer layer 218. The conformal spacer layer 218 may be deposited using various deposition techniques including, but not limited to, CVD, and may have a thickness ranging from approximately 3 nanometers to approximately 15 nanometers. The conformal spacer layer may be formed from various dielectric materials including, but not limited to, silicon nitride, silicon oxide, or silicon oxynitride. With respect to the transistor region 206, the spacer layer 218 is deposited on an upper surface of the substrate 202 and conforms completely to the outer periphery of the transistor fins 204 and the hardmask caps 212. With respect to the varactor region 210, the spacer layer 218 is deposited on an upper surface of the varactor region 210 and conforms completely to the outer periphery of the masking layer 214.

Figure 6:
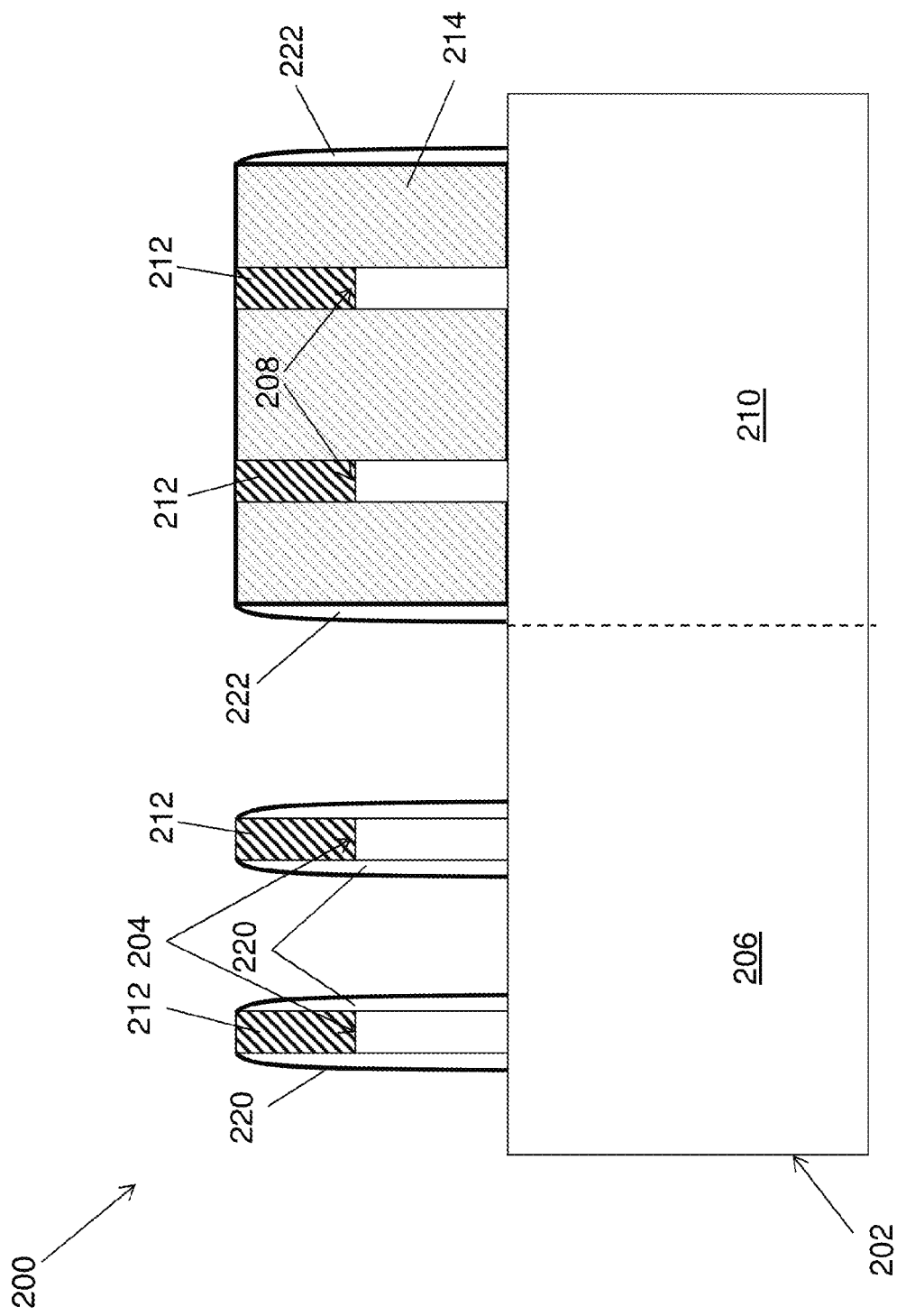

Turning to FIG. 6, the semiconductor device 200 is illustrated following a directional etching process which forms spacers in the transistor region 206 and the varactor region 210. In at least one embodiment, a directional etching process such as, for example, an RIE process selective to the material of the conformal spacer layer 218 (i.e., silicon nitride) is performed. In this manner, the conformal spacer layer (previously indicated as reference numeral 218) is removed from the upper surface of the transistor region 206 so as to form first spacers 220 on the sidewalls of the transistor fins 204 and the hardmask caps 212. With respect to the varactor region, second spacers 222 are formed on sidewalls of the masking layer 214. The resulting spacers 220/222 may have a thickness (i.e., horizontal width) ranging from approximately 2 nanometers to approximately 12 nanometers.

Figure 7:
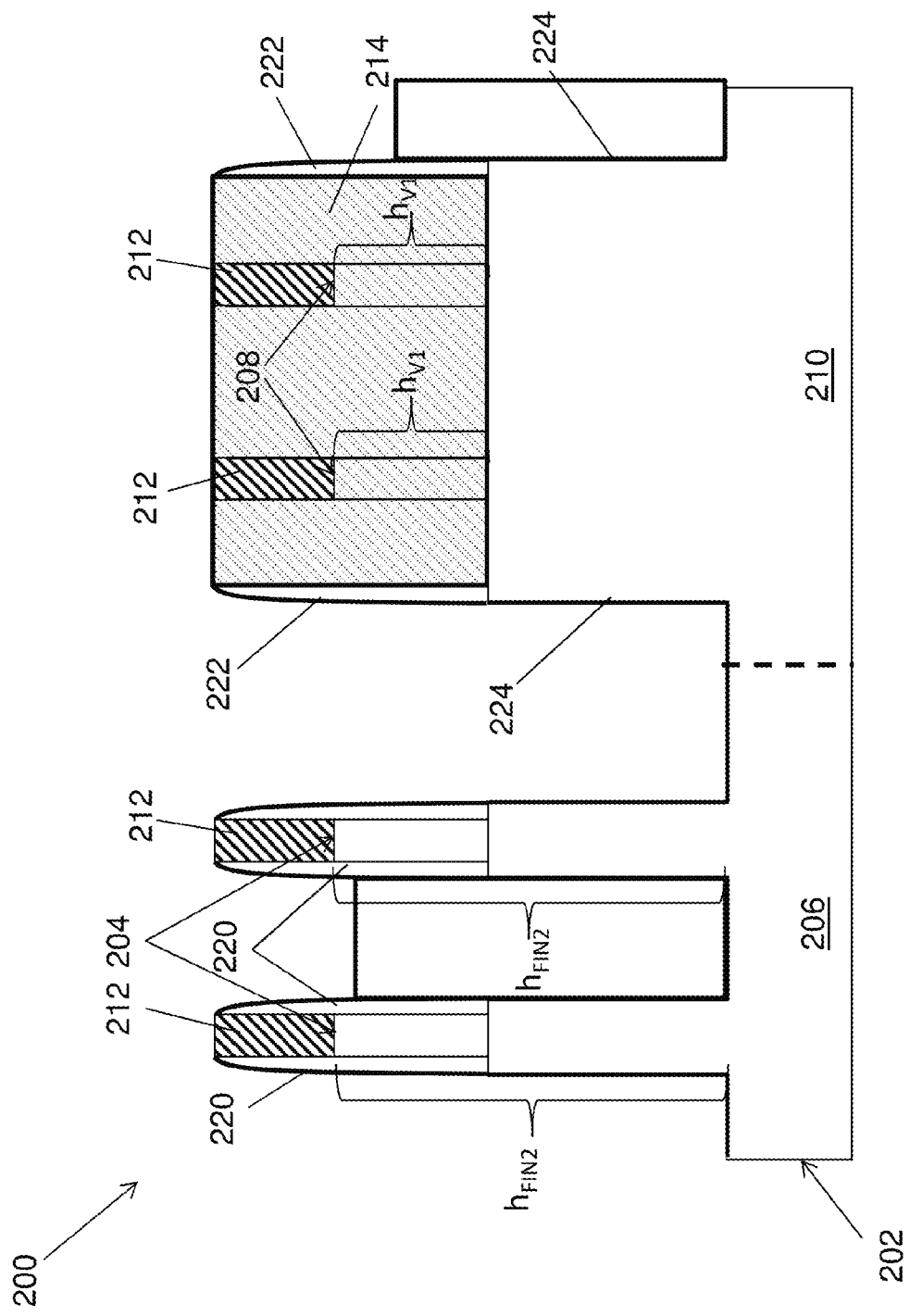

Referring now to FIG. 7, the semiconductor device 200 is illustrated after recessing the transistor region 206 with respect to the varactor region 210. According to at least one non-limiting embodiment, an RIE process selective to the material of the substrate 202 (e.g. Si) is performed. In this manner, the transistor region 206 is recessed so as to increase the physical height of the transistor fins 204 while the varactor region 210 is preserved due to the overlying masking layer 214.

Figure 8:
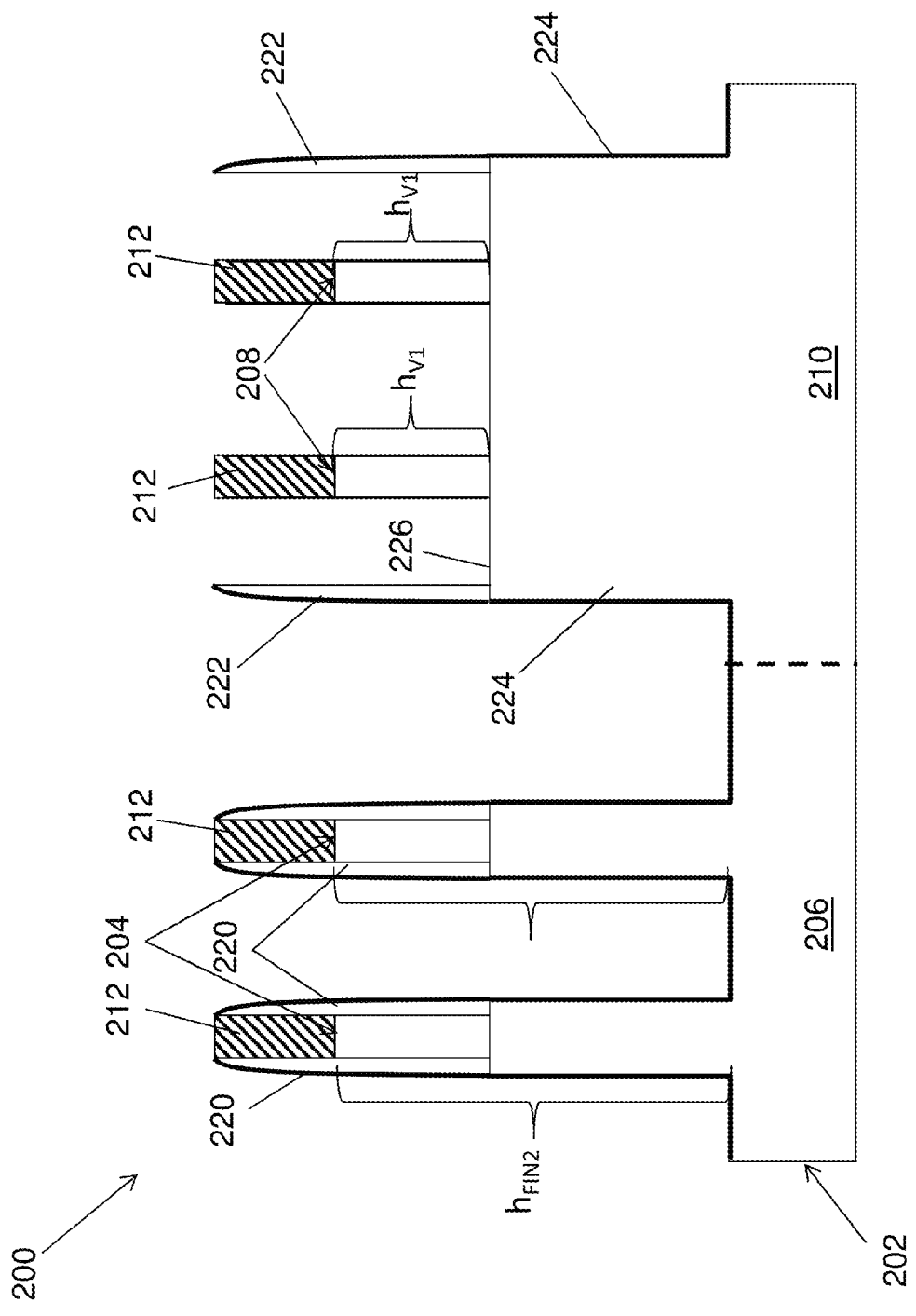

Referring now to FIG. 8, the masking layer (previously designated as reference numeral 214) is stripped away from the varactor region 210. As illustrated in FIG. 8, the total physical height ($h_{FIN2}$) of the transistor fins 204 is greater than the total physical height of the varactor fins 208. That is, the total physical height of the transistor fins 204 is defined as the vertical distance extending from the upper fin surface supporting the hardmask caps 212 to the base of the fins formed on the upper surface of the transistor region 206. In a similar manner, the total physical height of the varactor fins 208 is defined as the vertical distance extending from the upper fin surface supporting the hardmask caps 212 to the base of the fins formed on the upper surface of the varactor region 210. Accordingly, the total physical height ($h_{FIN2}$) of the transistor fins 204 is greater than the total physical height ($h_{V1}$) of the varactor fins 208. As further illustrated in FIG. 8, the first spacers 220 are formed directly against the sidewalls of the transistor fins 204. The second spacers 222, however, are substantially aligned with the sidewalls 224 of the varactor region 210, but are spaced apart from the varactor fins 208 so as to define a varactor planar region 226.

Figure 9:
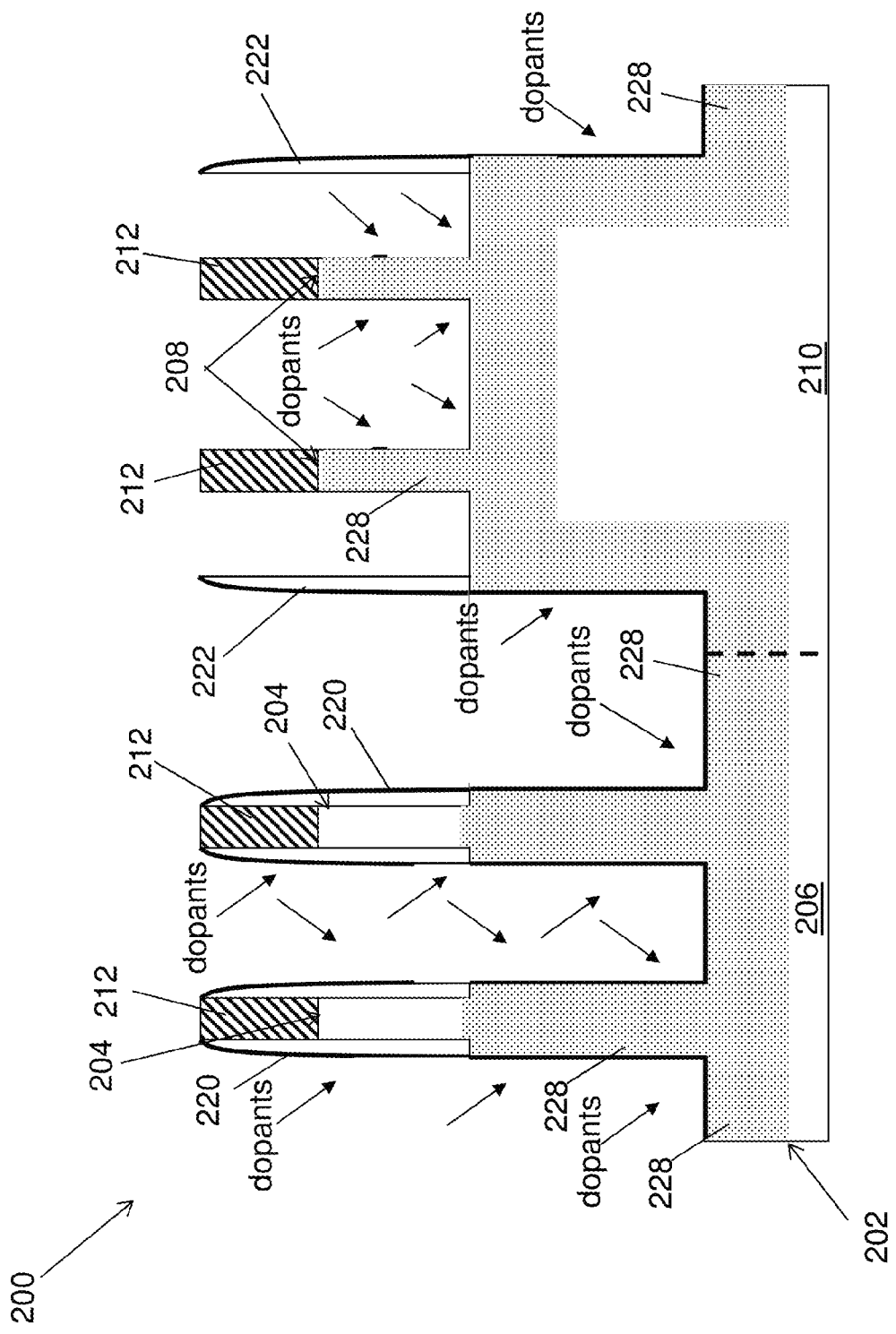

Turning now to FIG. 9, the semiconductor device 200 is shown undergoing a doping process that forms a doped region 228. In at least one embodiment, the doped region 228 serves as a punchthrough stop (PTS) layer which serves to suppress off-state current leakage in the semiconductor device 200. With respect to the FET, the doped region 228 serves as PTS region between source and drain. PTS 228 has dopants with a doping polarity opposite to the doping polarity in source/drain regions. PN junctions are formed between PTS 228 and source/drain region layer to suppress the off-state leakage current between source and drain. With respect to the varactor region 210, the doped region 228 serves to reduce the body resistance of the varactor. The resistance of the varactor body depends on the dopant concentration and the thickness of the doping layer. The typical doping concentration ranges from 5E17/cm3 to 1E19/cm3. The typical doping layer thickness ranges from 5 nm to 15 nm. Various doping techniques may be used including, but not limited to, plasma doping and gaseous doping. The types of dopants used during the doping process may be selected based on the type of semiconductor device that is being fabricated. For example, P-type dopants (e.g., boron or indium) may be utilized when forming an N-type semiconductor device (e.g. N-FET). Similarly, N-type dopants (e.g., phosphorous or arsenic) may be utilized when forming a P-type semiconductor device (e.g. P-FET).

As further illustrated in FIG. 9, the first and second spacers 220/222 control the location of the PTS layer 228. With respect to the transistor region 206, the PTS layer 228 is formed on an upper surface of the substrate 202 and in a lower portion of the transistor fins 204 so as to be self-aligned with the first spacers 220. The first spacers 220, however, inhibit doping diffusion thereby maintaining an undoped upper fin portion. It should be appreciated that the reason for maintaining an undoped upper portion of the transistor fins 204 is to create an undoped channel region corresponding to a finFET as understood by one of ordinary skill in the art.

With respect to the varactor region 210, the PTS layer 228 is formed on the upper surface of the substrate 202 and the entire body of the varactor fins 208. That is, unlike the transistor fins 204 which have an undoped portion the varactor fins 208 are completely doped. According to a non-limiting embodiment, the portion of the PTS layers 228 formed in the substrate 202 may have a thickness ranging from approximately 5 nanometers to approximately 15 nanometers.

Figure 10:
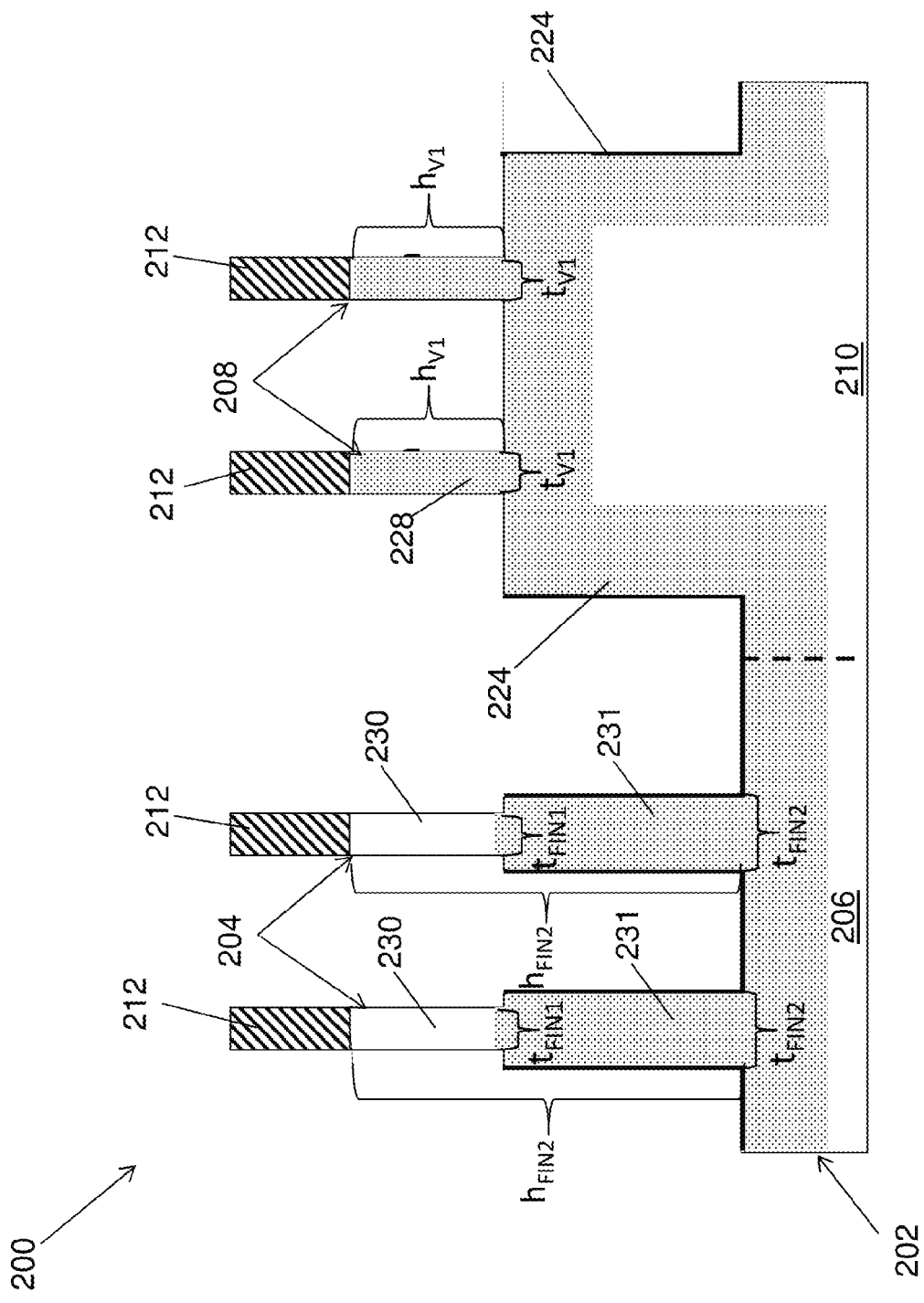

Referring to FIG. 10, the first and second spacers 220/222 are removed thereby leaving partially doped transistor fins 204 formed in a transistor region 206 and fully doped varactor fins 208 formed in the varactor region 210. As previously mentioned above, undoped portions 230 formed atop the PTS layer 228 of the transistor fin 204 define channel regions 230. In this manner, a lower doped portion 231 of the transistor fins 204 is formed between the undoped channel portion 230 and the upper surface of the substrate 101 (i.e., the upper surface of the transistor region 206). In addition, a portion of the PTS layer 228 is formed in the planar region 226 located in the varactor region 210.

Figure 11:
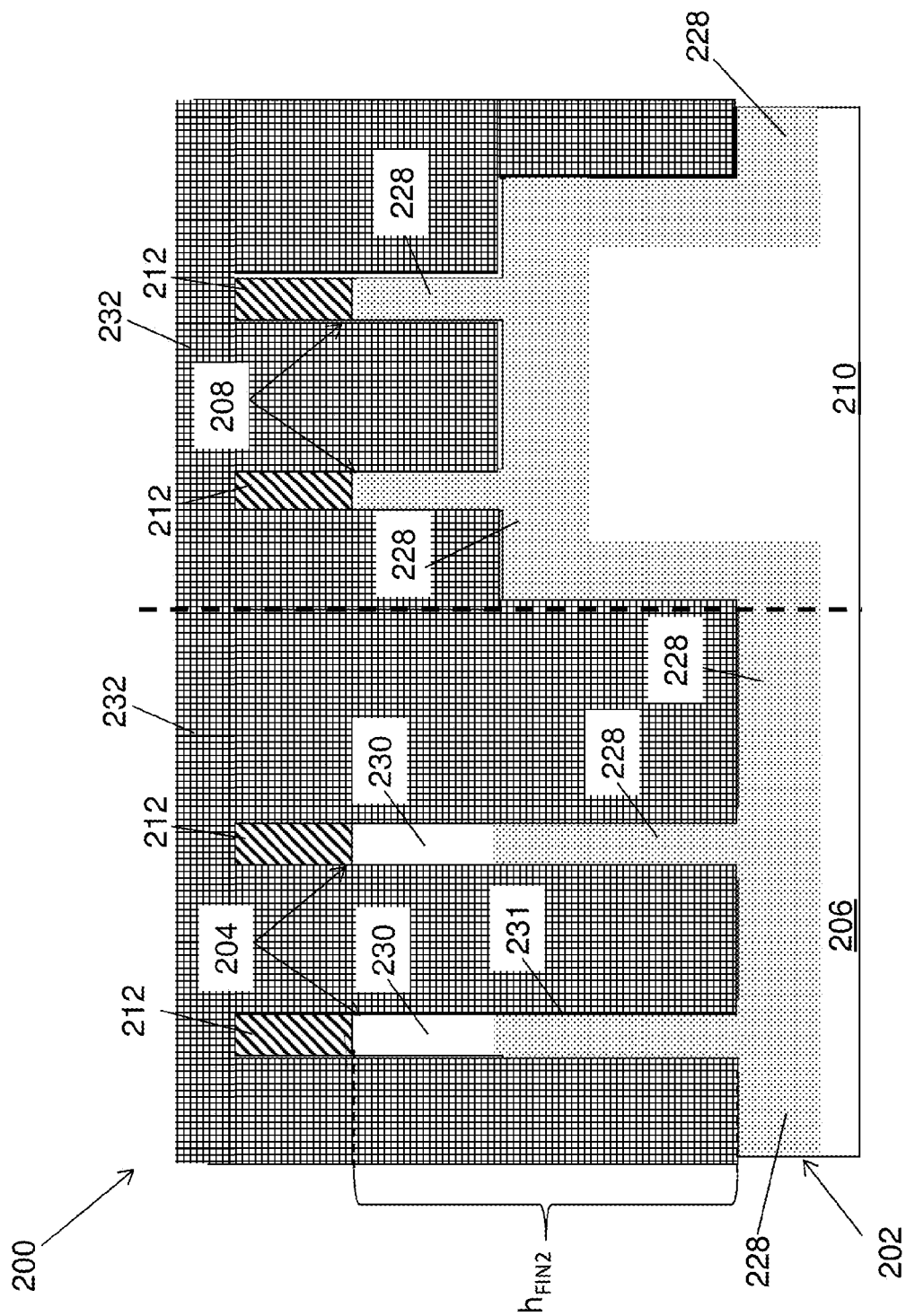

Turning to FIG. 11, a block shallow trench isolation (STI) layer 232 is deposited on an upper surface of the substrate 202 so as to cover the transistor fins 204 and the varactor fins 208. The STI layer 232 may be formed from various dielectric materials including, but not limited to, silicon oxide, silicon nitride, silicon oxynitride, or any suitable combination of those materials. The STI layer may be deposited using various deposition techniques including chemical vapor deposition (CVD). An etching process recessing the STI layer 232 (e.g., silicon oxide) may subsequently be performed which stops on an upper surface of the varactor region 210. In this manner, the STI layer 232 is formed flush with the upper surface of the varactor region

Figure 12:
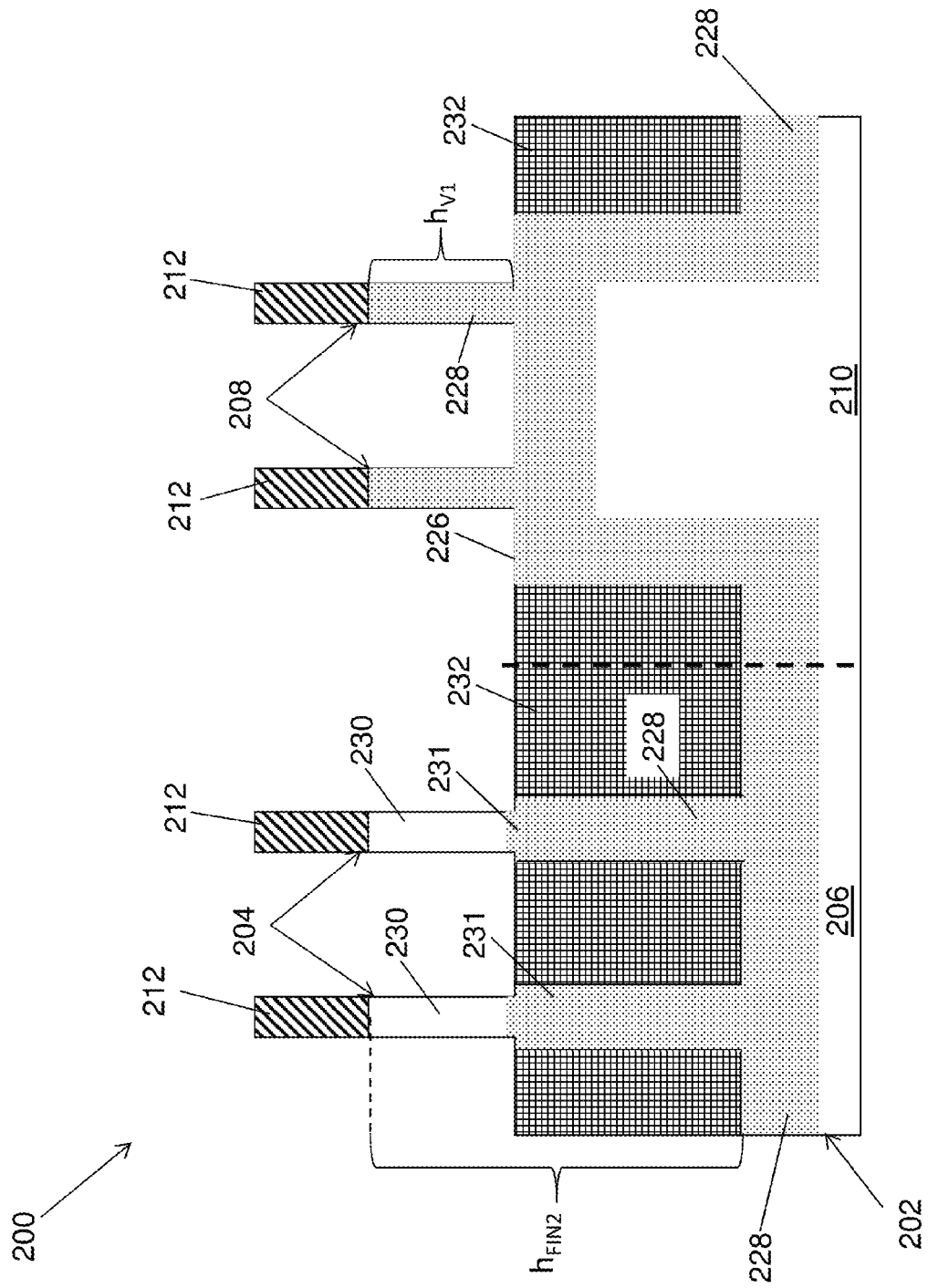

210. In addition, the varactor fins 208 and the undoped channel region 230 of the transistor fins 204 are exposed as further illustrated in FIG. 12. In at least one embodiment, the STI layer 232 may be recessed slightly (e.g., 5 nm) below the upper surface of the varactor region 210.

Figure 13:
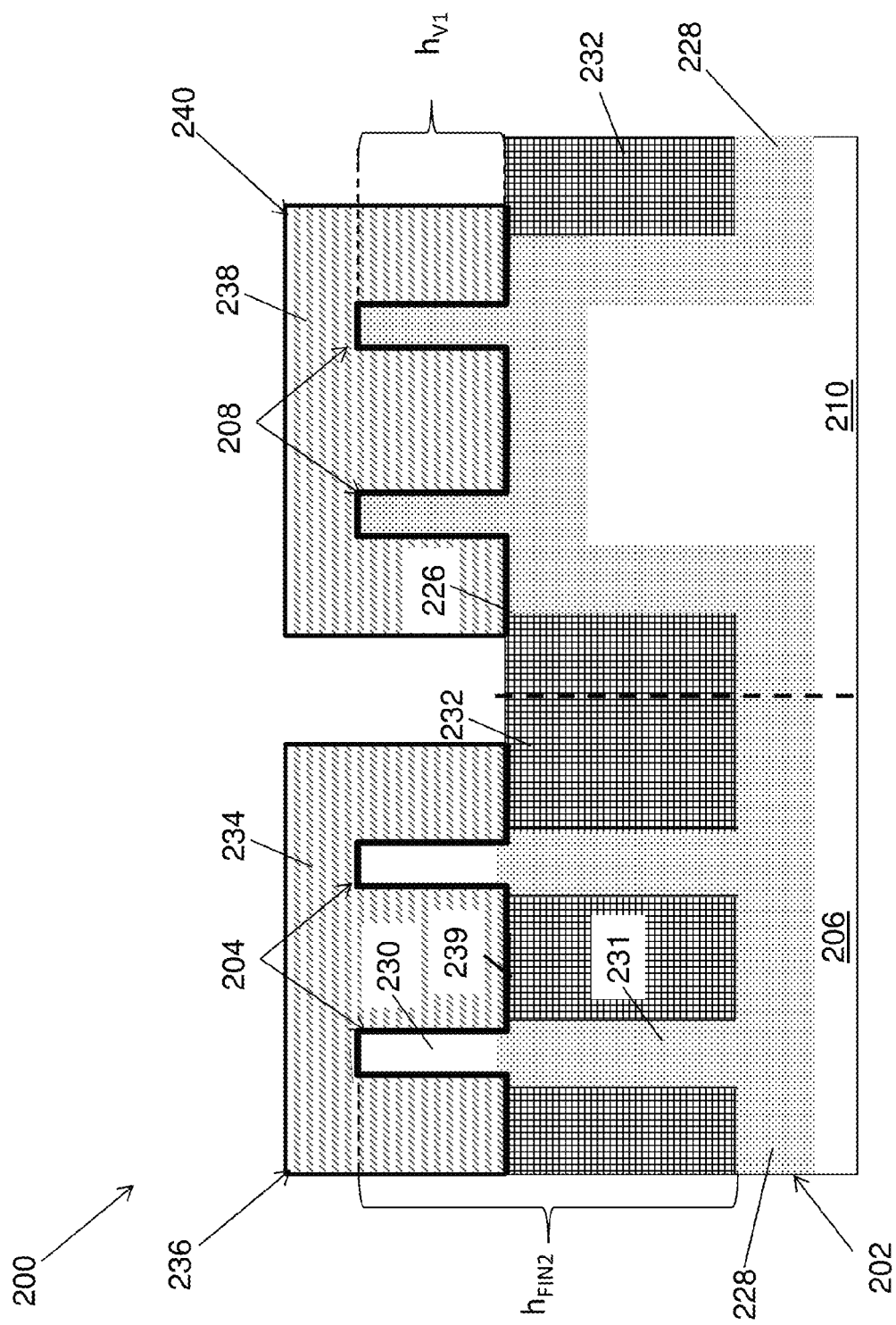
FIG. 13 illustrates the semiconductor device of FIG. 11 after forming a first gate structure that wraps around the first set of fins so as to form a finFET in the transistor region, and forming a second gate structure that wraps around the second set of fins so as to form a fin varactor in the varactor region.

Turning now to FIG. 13, the semiconductor device 200 is illustrated following removal of the hardmask caps 212 and after forming contact structures in the transistor region 206 and the varactor region 210. In at least one embodiment, a first contact structure 234 (e.g., a gate structure 234) is formed on an upper surface of the STI layer 232 and wraps around the exposed surfaces of the transistor fins 204 so as to form a finFET device 236 in the transistor region 206. The gate structure 234 includes a gate conductor (i.e., element 234 shown in FIG. 13) and a gate dielectric (i.e., element 239 in FIG. 13.). The gate dielectric 239 may be formed from various materials including, but not limited to, silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k may further include dopants such as lanthanum, aluminum.

A second contact structure 238 (e.g., varactor contact 238) is formed on a upper surface of the planar region 226 and wraps around the exposed surfaces of the varactor fins 208 so as to form a fin varactor in the varactor region 210. The second contact structure 238 includes a gate dielectric 241 formed from various materials including, but not limited to, silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k may further include dopants such as lanthanum, aluminum.

Accordingly, a finFET device 236 and a fin varactor device 240 are formed on a common semiconductor substrate 202. Unlike conventional semiconductor devices that include a finFET and a fin varactor on a common substrate, however, at least one embodiment of the invention provides a semiconductor device 200 of which the transistor fins 204 have a greater physical height compared to the varactor fins 208. In this manner, the fin varactor 240 has reduced body resistance compared to the conventional fin varactors that share a common substrate with a finFET device. Another feature of the invention provides a varactor 240 which includes both the vertical fin and the horizontal portion between fins 208. Therefore, the capacitance of the inventive varactor 240 is greater than prior art varactors using only the vertical fin as the varactor body.

Figure 14:
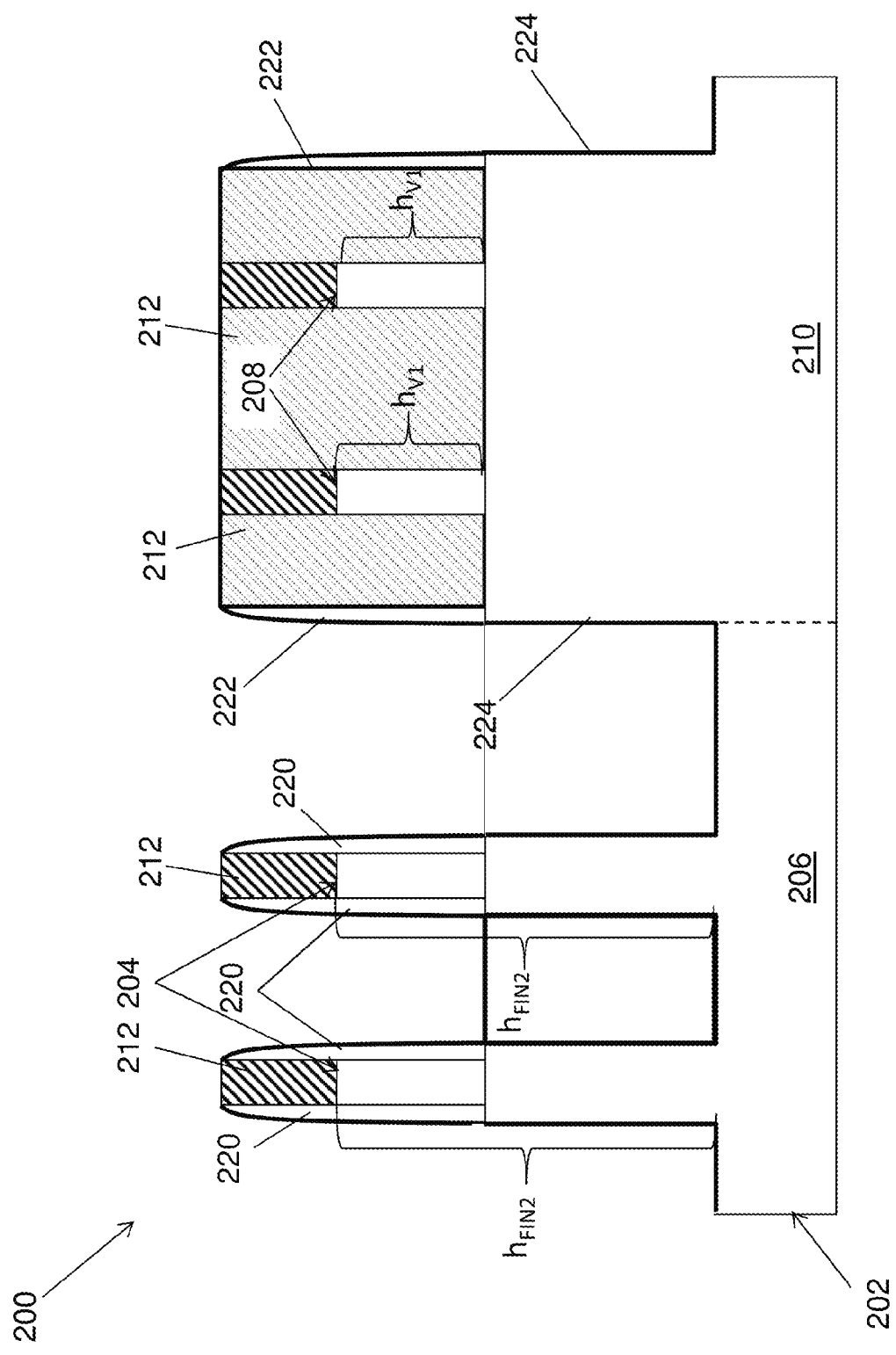

According to a non-limiting embodiment, the thickness of PTS region 228 associated with the transistor fins 204 may be adjusted with respect to the thickness of the transistors fin channel region (i.e., the region protected by the spacers 220). The reduced thickness of the PTS fin region 228 further reduces the off-state leakage current of the transistor device 236. Turning to FIG. 14, for example, the semiconductor device 200 is illustrated prior to performing the blanket doping process described in detail above.

Figure 15:
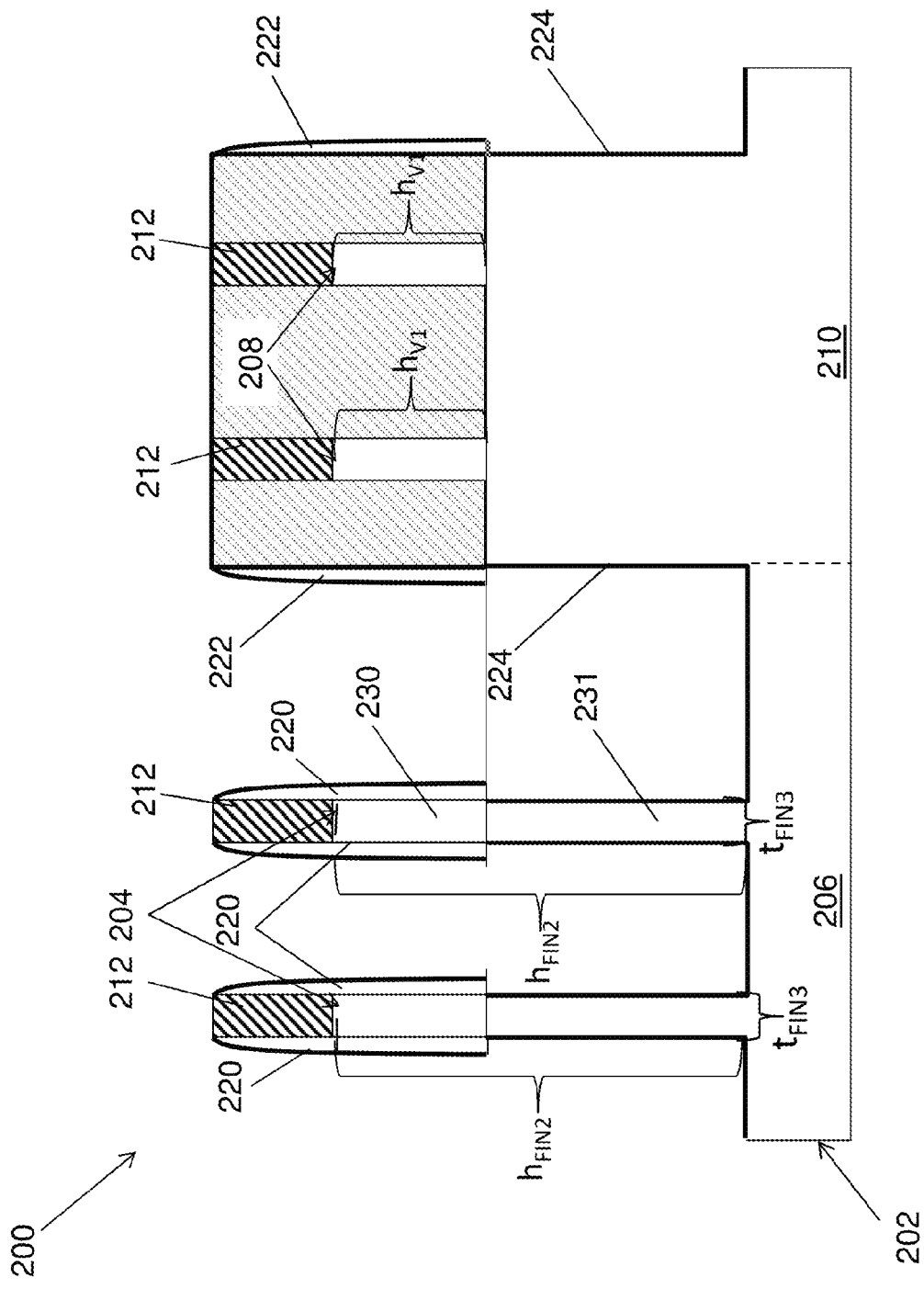

Turning to FIG. 15, the semiconductor device 200 is illustrated following an etching process that etches the exposed sidewalls of the fins 204. In at least one embodiment, the adjusted thickness (tFIN3) is equal to or substantially equal to the thickness of the undoped channel region 230. Accordingly, the thickness of the lower portion 231 of the fins 204 may be reduced while the masking layer 214 preserves the initial thickness of the varactor fins 208.

Figure 16:
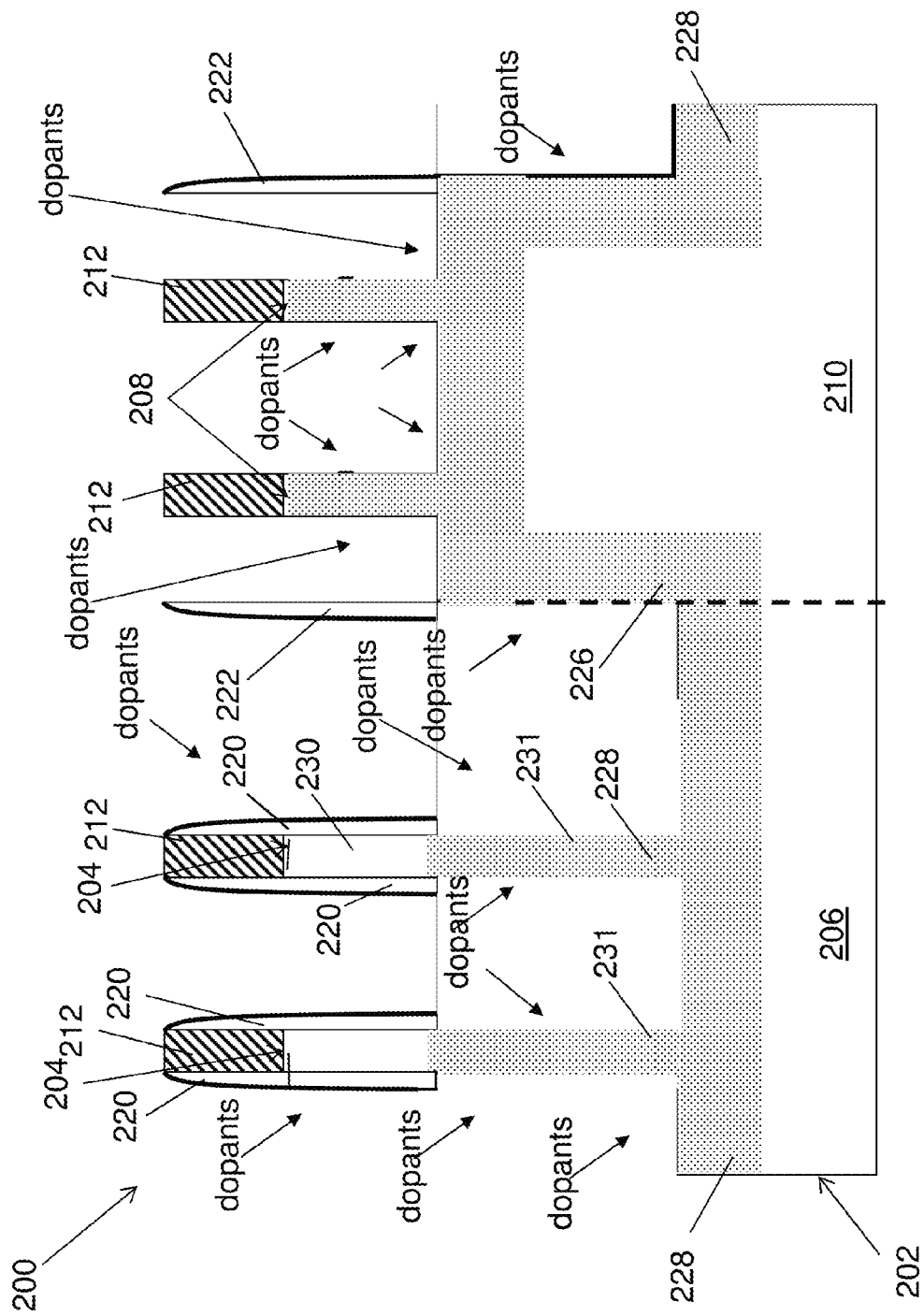

Turning to FIG. 16, a blanket doping process as described in detail above is performed so as to dope the transistor fins 204 and varactor fins 208 while simultaneously forming the PTS layer 228. As described above, the doped region 228 between the source and drain included in the transistor region 206 serves as a PTS having a doping polarity opposite to the doping polarity in source/drain regions. PN junctions are formed between PTS 228 and source/drain region layer to suppress the off-state leakage current between source and drain. For the varactor region 210, the doped region 228 serves to reduce the body resistance of the varactor. The resistance of the varactor body depends on the dopant concentration and the thickness of the doping layer 228. The doping concentration ranges, for example, from about 5E17/cm3 to about 1E19/cm3. The doping layer thickness ranges, for example, from about 5 nm to about 15 nm. Various doping techniques may be used including, but not limited to, plasma doping and gaseous doping. The types of dopants used during the doping process may be selected based on the type of semiconductor device that is being fabricated. For example, P-type dopants (e.g., boron or indium) may be utilized when forming an N-type semiconductor device (e.g. N-FET). Similarly, N-type dopants (e.g., phosphorous or arsenic) may be utilized when forming a P-type semiconductor device (e.g. P-FET).

As further illustrated in FIG. 16, the first and second spacers 220/222 control the location of the PTS layer 228. With respect to the transistor region 206, the PTS layer 228 is formed on an upper surface of the substrate 202 and in the thinned lower portion 231 of the transistor fins 204 so as to be self-aligned with the first spacers 220. The first spacers 220, however, inhibit doping diffusion thereby maintaining an undoped upper fin portion 230. It should be appreciated that the reason for maintaining an undoped upper portion 230 of the transistor fins 204 is to create an undoped channel region 230 corresponding to a finFET as understood by one of ordinary skill in the art.

With respect to the varactor region 210, the PTS layer 228 is formed on the upper surface of the substrate 202 and the entire body of the varactor fins 208. That is, unlike the transistor fins 204 which have an undoped portion the varactor fins 208 are completely doped. According to a non-limiting embodiment, the portion of the PTS layers 228 formed in the substrate 202 may have a thickness ranging from approximately 5 nanometers to approximately 15 nanometers.

Figure 17:
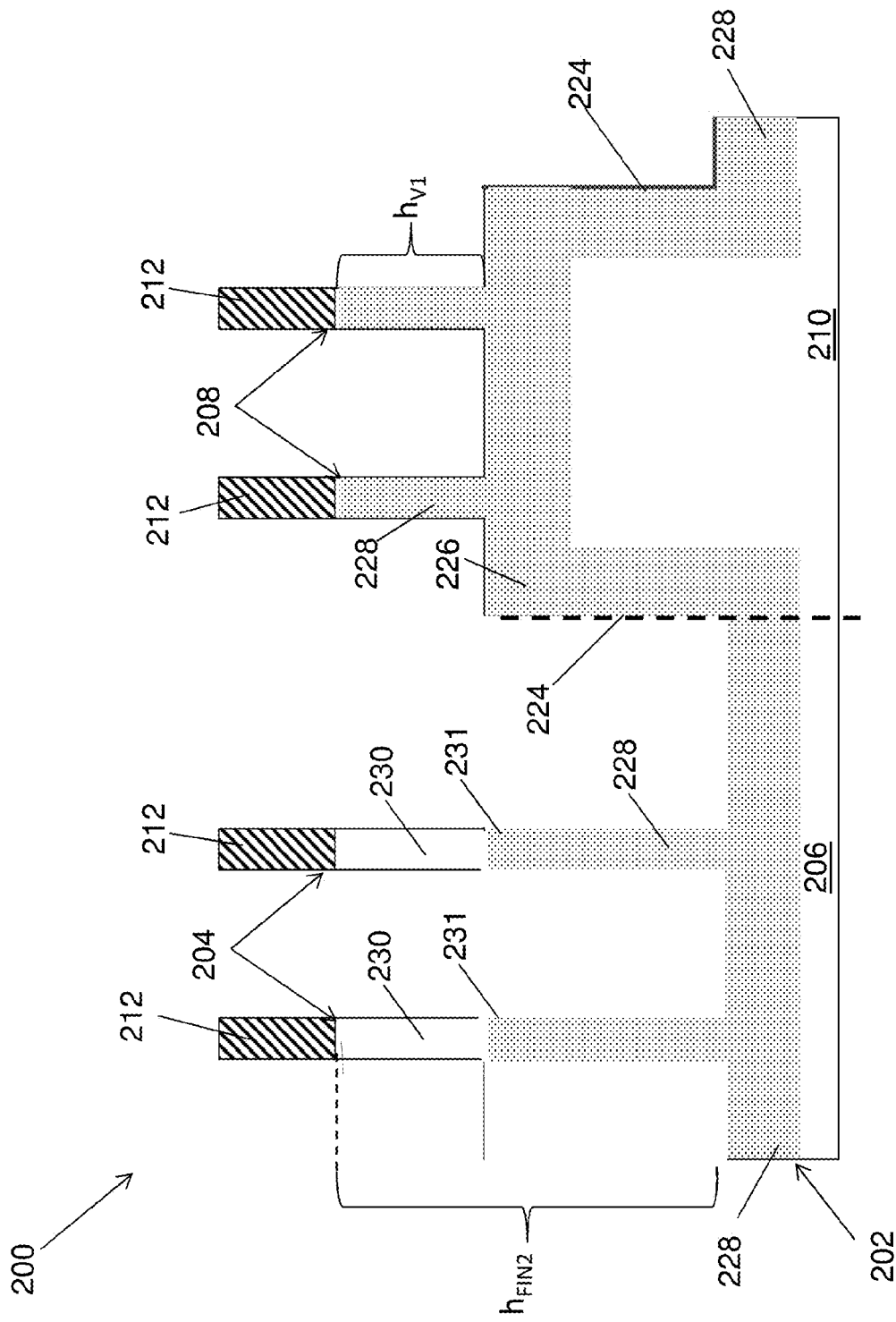

Referring to FIG. 17, the first and second spacers 220/222 are removed thereby leaving partially doped transistor fins 204 formed in a transistor region 206 and fully doped varactor fins 208 formed in the varactor region 210. The undoped portions 230 define a channel region 230 formed atop the doped thinned lower portion 231 of the transistor fin 204. In this manner, a lower doped portion 231 of the transistor fins 204 is formed between the un-doped channel portion 230 and the upper surface of the substrate 101 (i.e., the upper surface of the transistor region 206) so as to suppress off-state current leakage. In addition, a portion of the PTS layer 228 is formed in the planar region 226 located in the varactor region 210.

Figure 18:
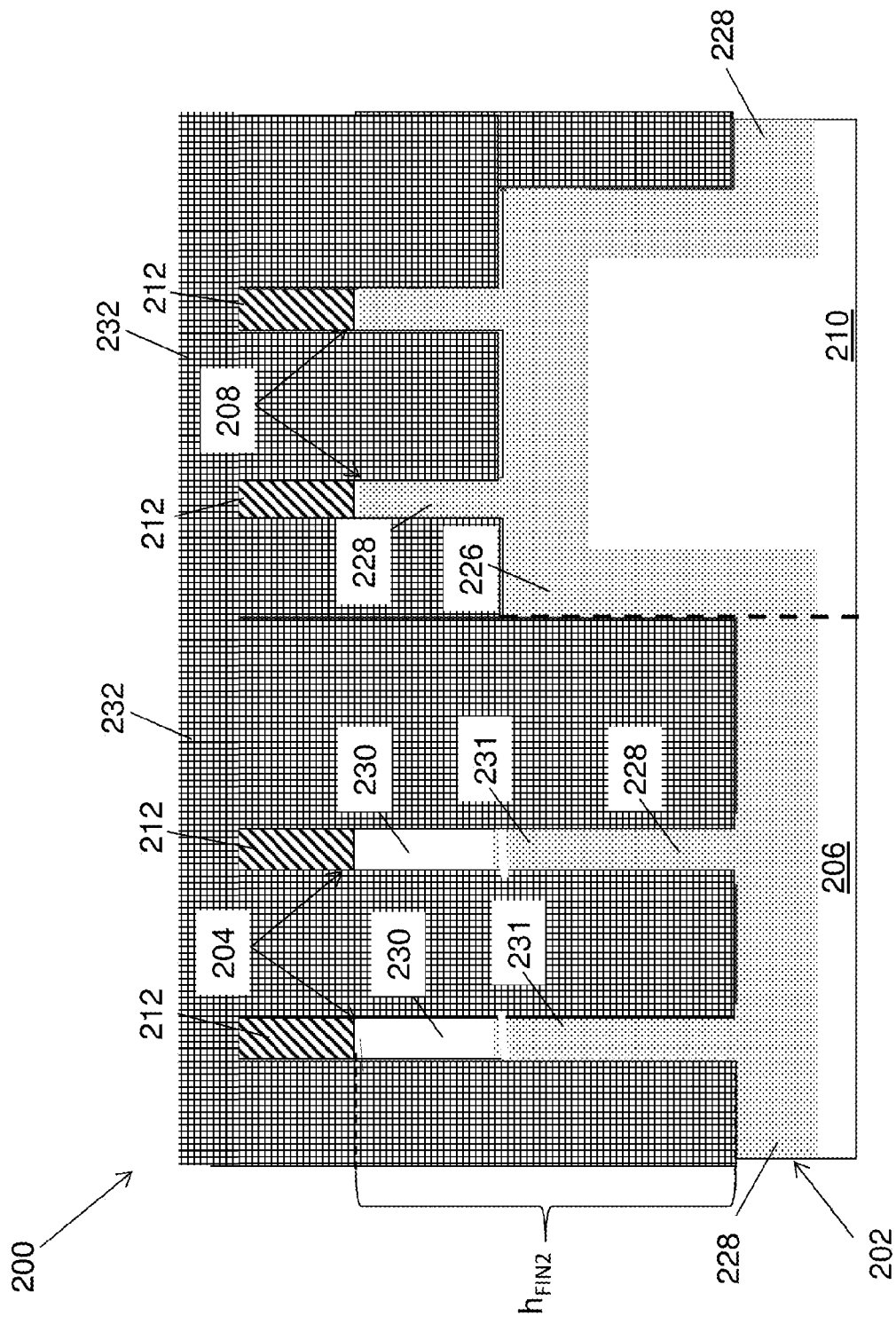
Figure 19:
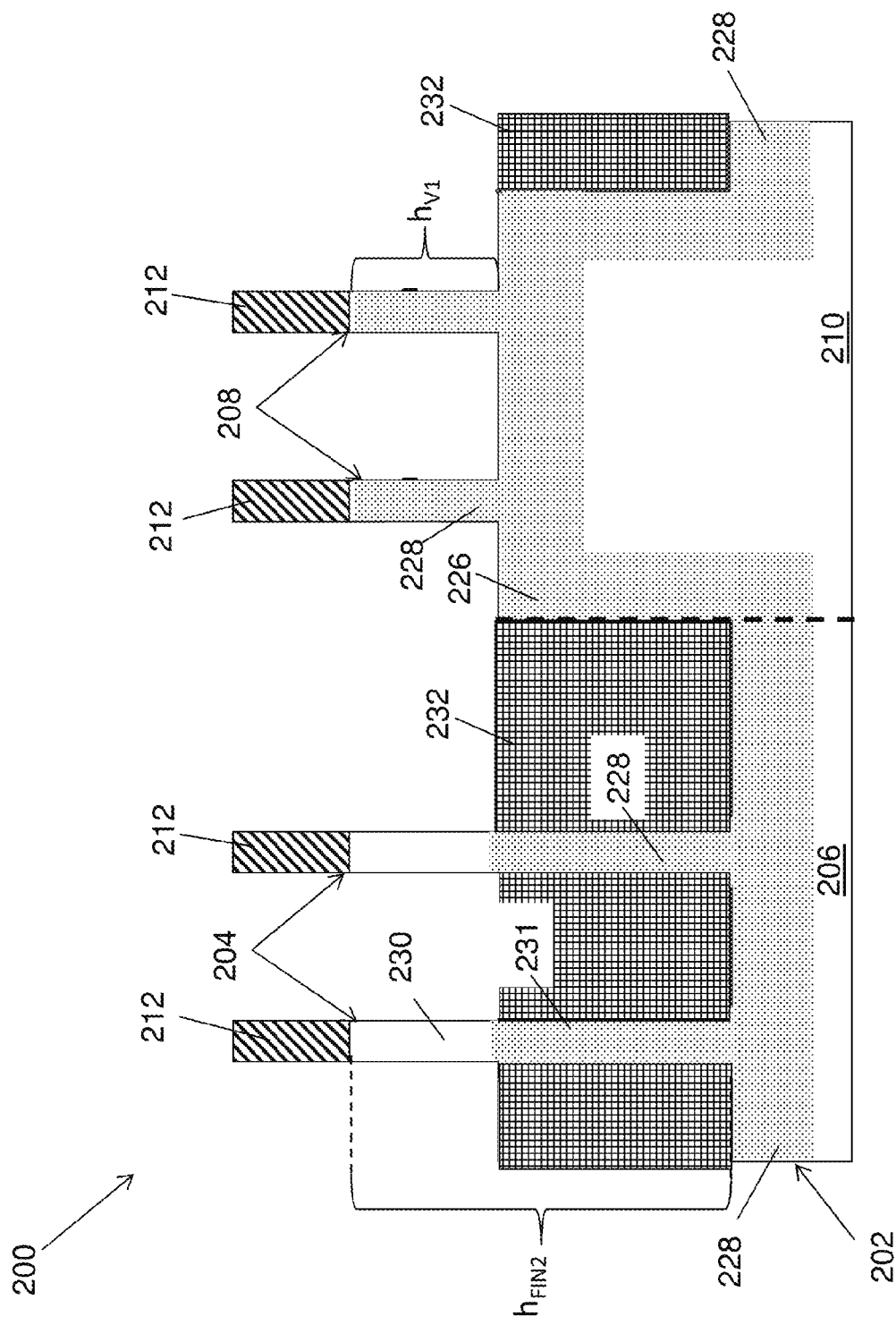

Turning to FIG. 18, a block shallow trench isolation (STI) layer 232 is deposited on an upper surface of the substrate 202 so as to cover the transistor fins 204 and the varactor fins 208. The STI layer 232 may be formed from various dielectric materials including, but not limited to, silicon oxide, silicon nitride, silicon oxynitride, or any suitable combination of those materials. The STI layer may be deposited using various deposition techniques including chemical vapor deposition (CVD). An etching process recessing the STI layer 232 (e.g., silicon oxide) may subsequently be performed which stops on an upper surface of the varactor region 210. In this manner, the STI layer 232 is formed flush with the upper surface of the varactor region 210. In addition, the varactor fins 208 and the undoped channel region 230 of the transistor fins 204 are exposed as further illustrated in FIG. 19. In at least one embodiment, the STI layer 232 may be recessed slightly (e.g., 5 nm) below the upper surface of the varactor region 210.

Figure 20:
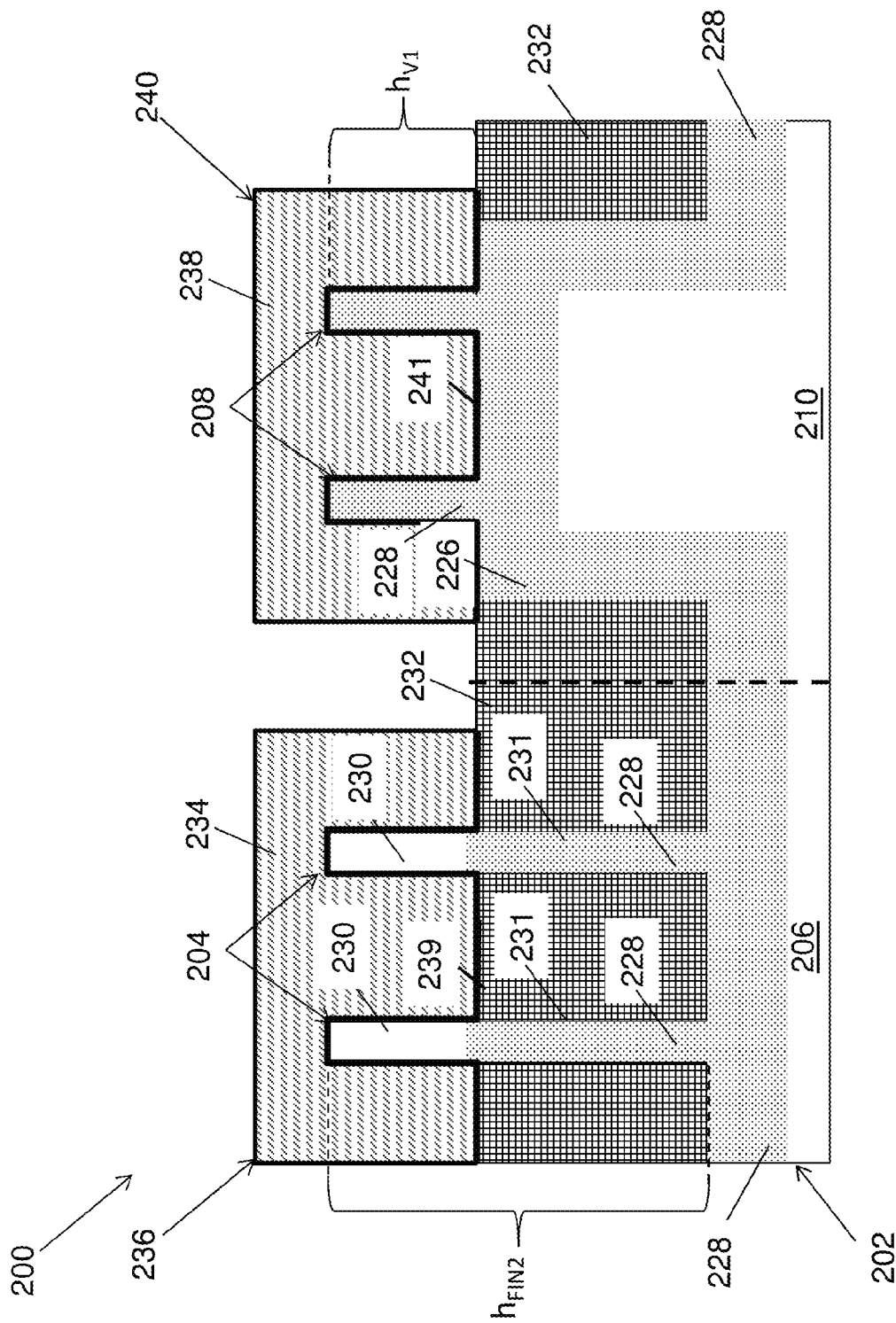

Turning now to FIG. 20, the semiconductor device 200 is illustrated following removal of the hardmask caps 212 and after forming contact structures in the transistor region 206 and the varactor region 210. In at least one embodiment, a first contact structure 234 (e.g., a gate structure 234) is formed on an upper surface of the STI layer 232 and wraps around the exposed surfaces of the transistor fins 204 so as to form a finFET device 236 in the transistor region 206. The gate structure 234 includes a gate conductor 234 and a gate dielectric 239. A second contact structure 238 (e.g., varactor contact 238) is formed on a upper surface of the planar region 226 and wraps around the exposed surfaces of the varactor fins 208 so as to form a fin varactor in the varactor region 210. The second contact structure 240 includes a gate conductor 238 and a gate dielectric 241.

Accordingly, a finFET device 236 and a fin varactor device 240 are formed on a common semiconductor substrate 202. Unlike conventional semiconductor devices that include a finFET and a fin varactor on a common substrate, however, at least one embodiment of the invention provides a semiconductor device 200 of which the transistor fins 204 have a greater physical height compared to the varactor fins 208. As a result, the fin varactor 240 has a reduced body resistance compared to conventional fin varactors formed on a substrate shared with a finFET device. Furthermore, the thinness of the transistor fins may be adjusted with respect to the varactor fins 208. In this manner, the body resistance of the semiconductor device can be further tuned.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a semiconductor device comprising:
    forming a first semiconductor fin corresponding to a field effect transistor (FET) on a first region of a semiconductor substrate and forming a second semiconductor fin corresponding to a varactor on a second region of the semiconductor substrate;
    recessing the first region with respect to the second region so as to increase a physical height of the first fin with respect to a physical height of the second fin such that the physical height of the second fin is less than the physical height of the first fin; and
    doping the first fin and the second fin so as to form a finFET in the first region and a fin varactor in the second region;
    forming a doped punchthrough stop (PTS) layer simultaneously beneath each the first semiconductor fin and the second semiconductor fin a first portion of the PTS layer extending from the upper surface of the first region into the semiconductor substrate at a distance to define a first PTS height, and a second portion of the PTS layer extending from the upper surface of the second region into the semiconductor substrate at the distance to define a second PTS height that matches the first height; and
    reducing a first thickness of the first fin while maintaining a second thickness of the second fin so as to adjust a first body resistance of the first fin with respect to a second body resistance of the second fin,
    wherein an upper portion of the first fin is un-doped, a lower portion of the first fin located beneath the upper portion is doped, and the second fin is entirely doped, and
    wherein the lower doped portion extends continuously from the upper undoped portion to the bottom of the first semiconductor fin and contacts the PTS layer.

2. The method of claim 1, wherein recessing the first region further comprises:
    depositing a masking layer atop the first and second regions so as to cover the first fin and the second fin, and selectively patterning the masking layer to expose the first region while maintaining coverage of the second region;
    depositing a conformal spacer layer atop the first region and the second region, the conformal spacer layer covering sidewalls and an upper surface of the first fin and an upper masking surface of the masking layer;
    performing a first etching process selective to the conformal spacer layer so as to expose the semiconductor substrate of the first region; and
    performing a second etching process selective to the semiconductor substrate so as to recess the first region with respect to the second region.

3. The method of claim 2, wherein the first etching process includes forming spacers on sidewalls of the first fin, and selectively doping the portion of the first fin includes inhibiting doping implantation in a covered portion of the first fin covered by the spacers while implanting dopants in the portion of the first fin.

4. A method of forming a semiconductor device comprising:
    patterning a semiconductor substrate including a first region and a second region so as to form a plurality of semiconductor fins;
    recessing the first region with respect to a second region so as to form a first semiconductor fin in the first region having a first total height and a second semiconductor fin in the second region having a second total height that is less than the first total height;
    reducing a lower thickness of the first semiconductor fin with respect to an entire thickness of the second semiconductor fin so as to adjust a first body resistance of the first semiconductor fin with respect to a second body resistance of the second semiconductor fin;

doping a portion of a channel region of the first semiconductor fin to form a finFET including an un-doped upper fin portion having a first thickness and a doped lower fin portion having a lower height and a second fin thickness that is different from the first fin thickness and entirely doping the second semiconductor fin to form a fin varactor having a doped varactor portion with a thickness, wherein doping the first semiconductor fin and the second semiconductor fin includes forming a doped punch-through stop (PTS) layer simultaneously beneath each the first semiconductor fin and the second semiconductor fin such that a first portion of the PTS layer extends from the upper surface of the first region into the semiconductor substrate at a distance to define a first PTS height, and a second portion of the PTS layer extends from the upper surface of the second region into the semiconductor substrate at the distance to define a second PTS height that matches the first height;

wherein a first total size of the doped lower fin portion defined by the lower height and the second fin thickness is greater than a second total size of the doped varactor portion defined by the second total height and the entire thickness of the second semiconductor fin such that the first body resistance of the finFET is greater than the second body resistance of the fin varactor.

5. The method of claim 4, wherein the first semiconductor fin includes a lower fin portion beneath the un-doped upper fin portion, and wherein the doping includes doping the entire lower fin portion of the first semiconductor fin.

6. The method of claim 5, further comprising doping the entire second fin without doping the upper fin portion of the first semiconductor fin.

7. The method of claim 6, wherein recessing the first region further comprises:

depositing a masking layer atop the first and second regions so as to cover the first semiconductor fin and the second semiconductor fin, and selectively patterning the masking layer to expose the first region while maintaining coverage of the second region;

depositing a conformal spacer layer that covers first sidewalls and an upper surface of the first semiconductor fin and second sidewalls and an upper masking surface of the masking layer;

performing a first etching process selective to the conformal spacer layer so as to expose the semiconductor substrate of the first region; and performing a second etching process selective to the semiconductor substrate so as to recess the first region with respect to the second region.

8. The method of claim 7, wherein doping the first portion comprises:

forming spacers on the first sidewalls located between the upper surface and the portion of the first semiconductor fin in response to the first etching process;

implanting dopants in the portion of the first semiconductor fin; and blocking dopants using the spacers so as to form a self-aligned un-doped channel region.

9. A method of forming a semiconductor device comprising:

patterning a semiconductor substrate including a first region and a second region so as to form a plurality of semiconductor fins;

recessing the first region with respect to a second region so as to form a first semiconductor fin in the first region having a first total height and a second semiconductor fin in the second region having a second total height that is less than the first total height;

modifying a thickness of a first portion of the first semiconductor fin while maintaining a second thickness of the second semiconductor fin so as to adjust a first body resistance of the first semiconductor fin with respect to a second body resistance of the second semiconductor fin; and doping the first portion of the first semiconductor fin to form a finFET, and entirely doping the second semiconductor fin to form a fin varactor, wherein doping the first semiconductor fin and the second semiconductor fin includes forming a doped punch-through stop (PTS) layer simultaneously beneath each the first semiconductor fin and the second semiconductor fin such that a first portion of the PTS layer extends from the upper surface of the first region into the semiconductor substrate at a distance to define a first PTS height, and a second portion of the PTS layer extends from the upper surface of the second region into the semiconductor substrate at the distance to define a second PTS height that matches the first height.

10. The method of claim 9, wherein the first semiconductor fin includes an upper fin portion and a lower fin portion beneath the upper fin portion, and wherein the doping includes doping the entire lower fin portion of the first semiconductor fin.

11. The method of claim 10, further comprising doping the entire second fin without doping the upper fin portion of the first semiconductor fin.

12. The method of claim 11, wherein recessing the first region further comprises:

depositing a masking layer atop the first and second regions so as to cover the first semiconductor fin and the second semiconductor fin, and selectively patterning the masking layer to expose the first region while maintaining coverage of the second region;

depositing a conformal spacer layer that covers sidewalls and an upper surface of the first semiconductor fin and an upper masking surface of the masking layer;

performing a first etching process selective to the conformal spacer layer so as to expose the semiconductor substrate of the first region; and performing a second etching process selective to the semiconductor substrate so as to recess the first region with respect to the second region.

13. The method of claim 12, wherein doping the portion of the first semiconductor fin comprises:

forming spacers on sidewalls of the first semiconductor fin located between the upper surface and the portion of the first semiconductor fin in response to the first etching process;

implanting dopants in the portion of the first semiconductor fin; and inhibiting doping implantation in a region of the first semiconductor fin covered by the spacers so as to form a self-aligned un-doped channel region.

14. The method of claim 13, wherein modifying the first thickness includes reducing a thickness of the first portion of the first semiconductor fin.

15. The method of claim 14, wherein reducing the thickness includes selectively etching the first region with respect to the spacers.

\* \* \* \* \*